United States Patent
Livesay et al.

(10) Patent No.: US 8,197,102 B2
(45) Date of Patent: Jun. 12, 2012

(54) FOLDABLE LED LIGHT RECYCLING CAVITY

(75) Inventors: William R. Livesay, San Diego, CA (US); Scott M. Zimmerman, Basking Ridge, NJ (US); Richard L. Ross, Del Mar, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

(21) Appl. No.: 13/200,896

(22) Filed: Oct. 3, 2011

(65) Prior Publication Data

US 2012/0063137 A1    Mar. 15, 2012

Related U.S. Application Data

(63) Continuation of application No. 12/154,318, filed on May 21, 2008, now Pat. No. 8,029,165.

(60) Provisional application No. 60/931,094, filed on May 21, 2007.

(51) Int. Cl.
*F21V 7/00* (2006.01)

(52) U.S. Cl. ......... 362/310; 362/247; 362/298; 362/341

(58) Field of Classification Search .......... 362/247, 362/296.01–296.1, 297–310, 341–350, 555
See application file for complete search history.

(56) References Cited

U.S. PATENT DOCUMENTS

| | | |
|---|---|---|
| 5,997,708 A | 12/1999 | Craig |
| 6,869,206 B2 | 3/2005 | Zimmrman et al. |
| 6,960,872 B2 | 11/2005 | Beeson et al. |
| 7,025,464 B2 | 4/2006 | Beeson et al. |
| 7,040,774 B2 | 5/2006 | Beeson et al. |
| 7,048,385 B2 | 5/2006 | Beeson et al. |
| 2006/0092639 A1 | 5/2006 | Livesay et al. |

*Primary Examiner* — William Carter
(74) *Attorney, Agent, or Firm* — William Propp, Esq

(57) ABSTRACT

LEDs are mounted onto a flat, thermally conductive, substrate, which is folded to form a light recycling cavity. A planar substrate is first coated with a metal layer, which is patterned to electrically connect the LEDs and to form bonding pads for wirebonds to connect the LEDs to external circuitry. The LEDs are mounted on the substrate. The substrate is then scribed on the backside to form the folds. The LED dies are then attached onto the metal islands (pads) defined on the substrate and wirebonds are used to connect the top side of the LED to adjacent patterned metal islands (pads) on the substrate. The substrate is then folded into a light recycling cavity where the LEDs are facing the inside of the cavity.

18 Claims, 26 Drawing Sheets

FOLDABLE LED LIGHT RECYCLING CAVITY

REFERENCE TO PRIOR APPLICATION

This application is a continuation of prior U.S. patent application Ser. No. 12/154,318, filed on May 21, 2008 now U.S. Pat. No. 8,029,165 and claims the benefit of U.S. Provisional Patent Application Ser. No. 60/931,094, filed on May 21, 2007, both which is herein incorporated by reference.

TECHNICAL FIELD

The present invention is related to the fields of semiconductor processing and light emitting diodes (LEDs). The invention is a method for assembling and manufacturing light recycling cavities. The light recycling cavities have a foldable substrate assembly for the LEDs, which attains high thermal conductivity for the LEDs and precise alignment of the LEDs when the substrate is folded to form the light recycling cavity.

BACKGROUND OF THE INVENTION

In U.S. Pat. Nos. 6,869,206, 6,960,872, 7,025,464, 7,040,774, and 7,048,385, there is shown an enhanced light source, which can be formed by placing LEDs in a light recycling cavity. These light recycling cavities can enhance the brightness of the LEDs which are used to form them, thereby achieving gains in brightness greater than 2

Forming these light recycling cavities requires precision placement of the LEDs and reflecting surfaces inside the cavity and also a means to dissipate the heat generated by the LEDs to exterior heatsinks. For example, in U.S. Pending Patent Application Publication Number US-2006-0092639-A1, "High Brightness Light Emitting Diode Light Source", to William R. Livesay et al., these LED light recycling cavities can be integrated with heatsinks.

However, not shown is a simple, inexpensive, and mass producible means of forming these light recycling cavities. In these light recycling cavities, unlike most conventional mounting methods, the LEDs are not placed in a planar arrangement. The individual LEDs or an array of LEDs are aligned orthogonal to the other LEDs or LED arrays inside the cavity.

This orthogonal alignment is quite different than most electronic component fabrication processes, which utilize planar fabrication methods and planar substrates or circuit boards. A substrate and its planar arrangement are in 2 dimensions. The light recycling cavity and its orthogonal alignment is in 3 dimensions. This orthogonal alignment makes it difficult or impossible to use high speed and mass production processes like surface mount, chip on board, etc. as conventionally practiced with 2 dimensional substrates to form these light recycling cavities in 3 dimensions. For example, a light recycling cavity may be formed by mounting LEDs on a thermally conductive substrate (aluminum nitride) and forming an array of LEDs thereon utilizing prior art techniques. Multiple arrays (similarly formed) are then individually mounted onto heatsinks, which are then brought into alignment to form a light recycling cavity.

However, precise alignment of these arrays to each other and within the recycling light cavity is required. This fabrication process can be tedious and difficult, requiring that each array have intimate thermal connection to an exterior heatsink. This requires attaching each substrate to a separate heatsink and then joining all of the arrays and heatsinks together to form a cavity while maintaining alignment and precise positioning of the LED arrays to each other within the cavity. Due to the three dimensional nature of the finished cavity, it is difficult to use high speed manufacturing means such as pick and place machines to mass produce these assemblies.

Therefore, there is a need for an improved method of forming these light recycling cavities that simplifies the assembly of the light recycling cavity and maintains alignment of the LEDs within the light recycling cavity. In U.S. Pat. No. 5,997,708, Craig discloses a foldable substrate utilizing a multilayer assembly. However, this assembly is complex and requires bonding other materials to the substrate to provide a suitable hinge to effect the fold. This requires extra process and alignment steps.

In the prior art, electronic packages that have incorporated foldable elements have utilized flex circuits formed by a metal (for the electrical interconnect) deposited onto a pliable substrate usually plastic (e.g. polyimide, Mylar, etc.) to form the foldable material or hinge.

However, there are several drawbacks to these prior art techniques particularly in an assembly requiring high alignment accuracy and high thermal conductivity. Most polymers have very low thermal conductivity and low maximum service temperatures. If the polymer is used only for the hinge material, it must be somehow attached to the target substrate. This attachment requires an adhesive which must also have a maximum working temperature sufficiently high to allow die attachment processes to be performed. This die attachment process also adds an additional process step to form the foldable assembly that is not easily performed in a planar process.

The hinge, if so attached, requires that it have excellent adhesion to the substrate (to the edge of the substrate at the folding joint) so that alignment of the LEDs of the light recycling cavity is maintained when the substrate is folded. Most polymer materials require a minimum thickness for mechanical robustness. However, the minimum bend radius is at least the thickness of the material. For example, if a 0.025 mm (0.001") thick polyimide layer is used as the hinge material, this requires at least at least a 0.025 to 0.050 mm or greater bend radius. This variable bend radius imparts an uncertainty to the position of the substrate parts when folded. A requirement for a recycling light cavity is to have very few or small gaps between the LEDs within the cavity. This uncertainty in the position of the LEDs requires larger spacing (between LED arrays so they will not mechanically interfere) and lowers cavity efficiency.

Therefore, there is a need for a highly accurate means of forming these light recycling cavities without increasing process steps.

SUMMARY OF THE INVENTION

The invention is a method for assembling and manufacturing light recycling cavities having a foldable substrate assembly for the LEDs. The light recycling cavity attains high thermal conductivity for the LEDs and precise alignment of the LEDs when the substrate is folded to form the light recycling cavity. Prior art techniques incorporate flexible substrates, extra processing steps, or dedicated materials to form hinges. The present invention discloses a novel foldable substrate assembly while not requiring any additional process steps than that required for making conventional planar LED arrays.

Specifically, the invention comprises a foldable substrate wherein LEDs are mounted onto a flat, thermally conductive substrate (e.g. aluminum nitride). The substrate (aluminum nitride) is electrically isolating but thermally conductive.

This invention discloses a foldable substrate assembly that utilizes simple processing steps similar to those processing steps required to assemble a conventional planar array and requires no extra processing steps to form or add a hinge. A planar aluminum nitride substrate is first coated with a metal layer 1 to 15 micrometers thick. As is done with planar arrays, this metal layer (Au, Ag, Cu, Ni, etc.) is patterned to electrically connect the LEDs in series or parallel arrangement and to form bonding pads for wirebonds to connect the LEDs or external circuitry. The metal layer is thick enough (preferably 3 µm to 12 µm) to carry the current (0.1 to 10 amps) required for driving high brightness LEDs.

Prior to LED die attach, the aluminum nitride substrates are partially scribed, cut or sawed on the backside (of the substrate) to allow breaking of the substrate to form walls for a cavity. The sawing or cutting of the substrate is done in such a way as to not cut the metal patterned (gold) layer on the topside.

Next, the LEDs are mounted (die attached) via solder or conductive epoxy. This mounting allows the LEDs to be placed on a substrate via high speed pick and place equipment as the substrate assembly is in a planar orientation for LED mounting and adding interconnects (wire-bonding, etc.). The metal layer is pre-deposited (plating, sputtering, evaporation, etc.) on the foldable substrate and is patterned prior to the placement of the LEDs and, therefore, ensuring that the LEDs are aligned to the substrate and relative to themselves. This pre-deposition eliminates the alignment step required to form light recycling cavities by using discrete substrates to form the sides, bottoms, etc.

In one of the preferred methods of this invention, an aluminum nitride substrate is coated with a metal layer on both sides. One preferred metal layer is gold in a thickness layer of 3 to 15 microns. The metal layer is patterned to form the interconnects to the LEDs, for example, a top and bottom electrode running in close proximity to where the LED will be mounted. The metal layer may also be patterned to provide alignment marks or solder dams for accurate placement of the LEDs. These patterned metal islands or electrodes may be configured to provide interconnects to each of the LEDs in either a series or parallel configuration. The patterning of the metal can be via conventional photolithography using either a subtractive etching process or an additive plating process or alternatively, the patterned metal island interconnects may be formed by cutting the gold with a laser ablation process.

The substrate is then scribed or cut on the backside of the substrate (opposite side from the patterned metal). The scribing can be done via either a diamond saw, laser, or other such means. The scribing is done to cut through the bottom side metal layer, the substrate (e.g. aluminum nitride), but not through the top side patterned metal layer. Alternatively, the substrate is only partially cut and later cracked to form the folds. In this way, the substrate will remain rigid in a planar configuration for die attach and wirebonding.

The LED dies are then attached with a eutectic solder onto the metal islands (pads) defined on the substrate. Wirebonds (gold, silver, aluminum, etc.) are used to connect the top side (cathode) of the LED to adjacent patterned metal islands (pads) on the substrate. Because all these processes are performed on a planar substrate assembly, high speed conventional processing methods may be used (e.g. pick and place, etc.).

The 2 dimensional substrate is then folded into a 3 dimensional light recycling cavity where the LEDs are facing the inside of the cavity. The thin metal layer (gold, silver, nickel, platinum, etc.) which provides the electrical connection also acts as the hinge that allows the substrate to be folded into a three-sided trough, four-sided cavity, or a five-sided box. Since the patterning of the metal and scribing is done in a precise manner, and the LEDs are placed in a precise manner when the substrate is folded, it forms a perfectly aligned cavity and can be positioned into a simple slotted heatsink and secured via solder or thermally conductive adhesive.

Synergistically, this invention solves the difficult problem of electrically connecting LEDs or arrays of LEDs that are oriented at 90° and 180° to each other in forming a light recycling cavity. This problem is solved because the hinge material is also the interconnect to the adjoining sides of the cavity, thereby seamlessly crossing from one side (LED array) to another. The thin metal interconnect layer will be robust enough to act as a hinge to a rigid substrate packed with LEDs. The cavity only has to be folded once and then is secured in a mechanically stable holder of a heat spreader.

DETAILED DESCRIPTION OF THE PREFERRED EMBODIMENTS

The preferred embodiments of the present invention will be better understood by those skilled in the art by reference to the above listed figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention. The above listed figures are not drawn to scale. In particular, the thickness dimension of the substrate, LEDs, and metallization layer, which acts as both an electrical interconnect and hinge, is expanded to better illustrate the various layers of the embodiments.

Figure 1A:
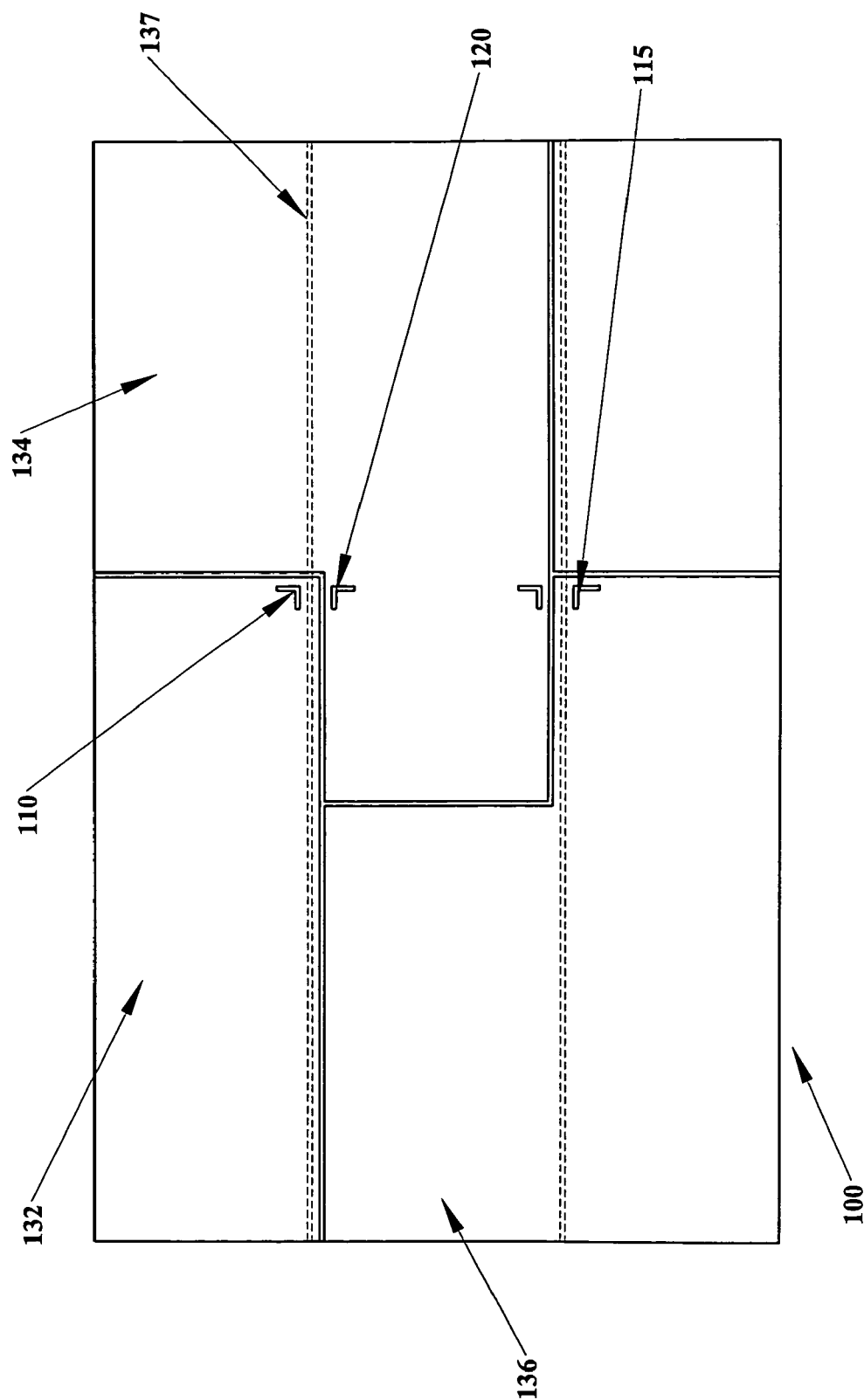
FIG. 1A is a top plan view of a three-section patterned metal coated substrate of the present invention.

FIG. 1A shows a top plan view of a three-section light recycling cavity substrate assembly 100 prior to folding into a cavity. This particular recycling light cavity will have three sides with a single LED or a planar array of LEDs on each of the three sides. This view shows the substrate before the LEDs are mounted. The substrate can be fabricated from aluminum nitride, copper tungsten, alumina, etc. Alignment marks 110, 115, 120 are patterned into the metal layer for accurate placement of the LEDs or LED arrays to the substrate. In this figure, the substrate is shown with a patterned metal layer which forms the interconnects between the LEDs (LEDs are not mounted or shown in this view). This metal layer is preferably made from a high electrical conductivity metal (e.g. gold, copper, silver, etc.).

The metal layer is first deposited onto the substrate by sputtering, evaporation, plasma jet, electroplating, or other means. The metal layer is then patterned into isolated islands that form bond pads to connect to the base of the LED, isolated islands for wirebonding to the top contacts of the LED and isolated islands to connect to external power. The metal layer may be patterned using a laser to etch or ablate the metal or, alternatively, the metal may be patterned using a photolithography process wherein the gold is coated with photoresist, the photoresist exposed through a mask, developed, and the gold etched through the photoresist mask. The metal is patterned to form interconnects to the LEDs and between LEDs on adjacent sides. For example, the patterned metal forms an electrical island 132 which will make contact with the bottom contact of an LED or LEDs placed thereon.

Island 134 provides a wirebonding pad for wirebonds that make contact to the top surface contact (cathode) of the LED mounted on island 132. Island 134 is also the bottom (anode) contact for the center LED array aligned to alignment marks 120. Island 134 extends across the foldable joint indicated by the dotted line 137. Island 136 provides the wirebond pad connection to the top contact (cathode) of the center LED array (on island 134) and the bottom anode connection to the right-side LED array. Finally, island 138 provides the wirebond pad for the top contact to the LED or LED array mounted on island 136 and the contact for external power.

Optionally, a metal coating is also deposited on the backside of the substrate. The metal coating can be gold, silver, copper, etc. This backside metal coating can be used to permit attachment of the completed assembly to a heat spreader or heatsink with eutectic solder. This backside metal is otherwise unpatterned.

After patterning of the top metal layer, the substrate is scribed, sawed, or cut with a laser, saw, diamond scribe, etc. on the backside of the substrate (the side opposite of the patterned metal).

Figure 1B:
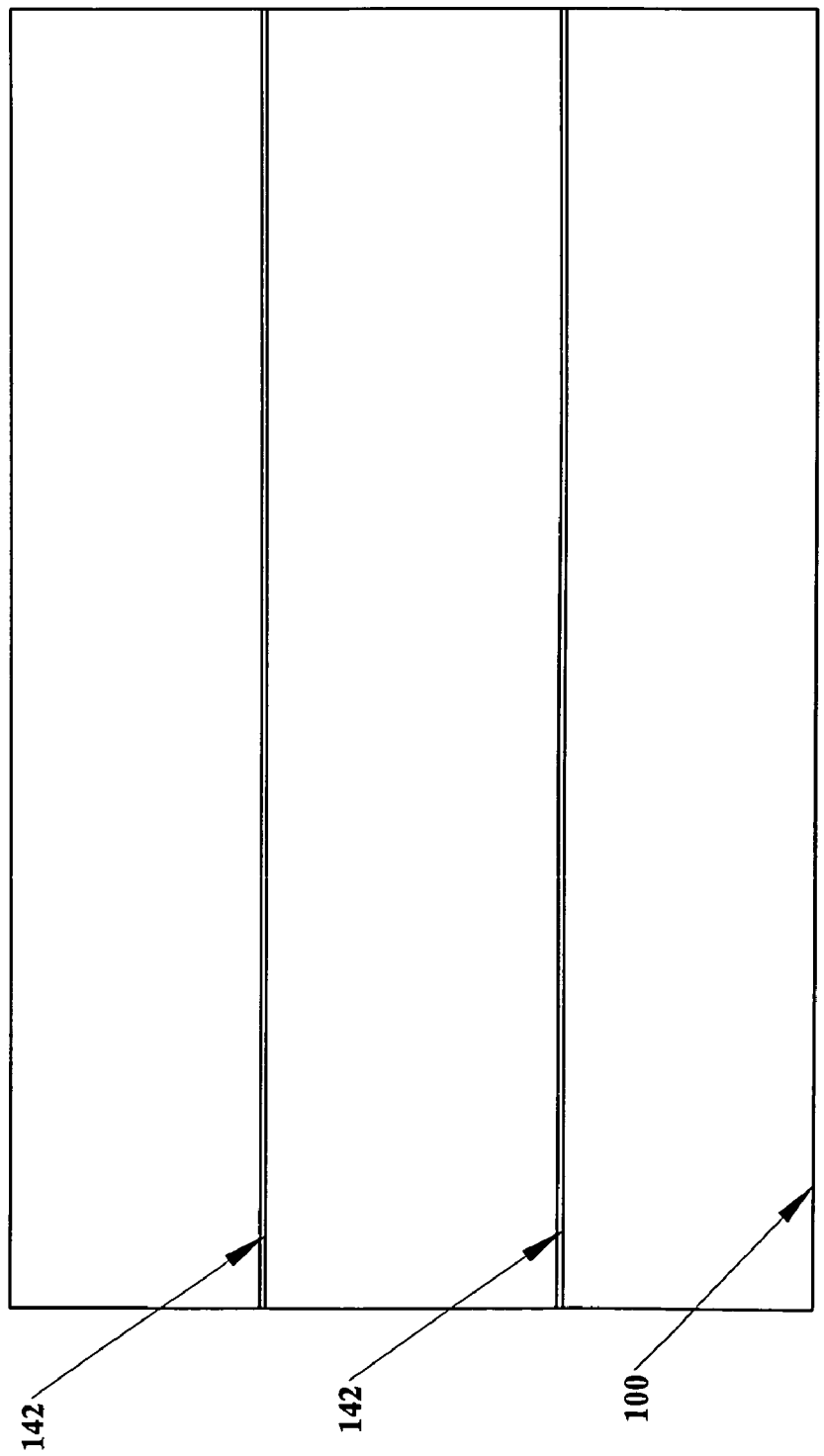
FIG. 1B is a bottom view of the three-section metal coated substrate with cut grooves of the present invention.

FIG. 1B shows the substrate with cut channels on the backside of the substrate. These cut channels correspond to the fold lines 137, 139 shown in FIG. 1A.

Figure 1C:
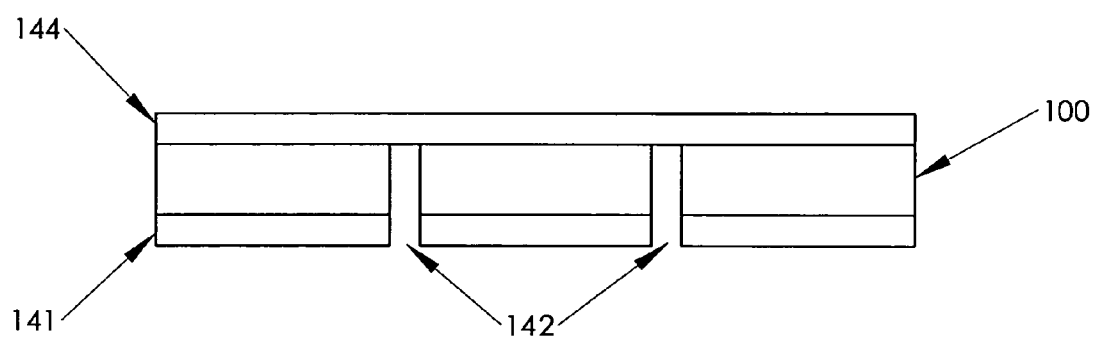
FIG. 1C is a cross-sectional view of the channels cut in the underside of the substrate of the present invention.

FIG. 1C shows a cross-section of these cut channels wherein the channels 142 extend through the optional backside metal 141 and through the substrate 100 or partially through the substrate, but not through the patterned metal layer 144 on the opposite side of the substrate. In this figure, the thickness of the substrate and metal layer are not to scale. Preferable substrate thickness is 0.05 mm to 0.350 mm. Preferable thickness for the bottom metal layer 141 is 2 µm to 4 µm. Preferable thickness for the top patterned metal layer is 3 µm to 15 µm and more preferably 5 µm to 10 µm. For this cutting process, a narrow kerf is desirable, preferably smaller than 100 µm and more preferably less than 25 µm, and even more preferably less than 15 µm. A narrow kerf will help maintain the precise alignment of the sides and LEDs when the cavity is folded.

Next, the LEDs are mounted onto the patterned metal islands on the substrate. This is preferably done using a eutectic metal alloy soldering process, such as 80% gold /20% tin. This gold/tin eutectic is typically applied to the LEDs prior to this die-attach step or, optionally, the substrate can be coated with a solder eutectic. This gold/tin eutectic is typically 3 to 6 microns thick. Gold/tin eutectics require heating to temperatures in excess of 300° C. to get a reliable void-free joint. Accordingly, all materials that are used on the substrate up to this point must be stable and not oxidized or melt at these high temperatures. This prevents the use of most polymer flex circuit materials.

Polymer materials used in flex circuits are flexible but have intrinsically low thermal conductivity. Most substrates that exhibit high thermal conductivity like aluminum nitride, aluminum, copper tungsten, etc. are rigid and brittle and cannot be folded without cracking. Therefore, to fabricate a foldable assembly with rigid substrates requires assembling separate substrates and joining them with a flexible material. However, that fabrication requires extra process steps and requires alignment of the individual substrates if the final assembly is to form a precisely aligned structure.

Figure 1D:
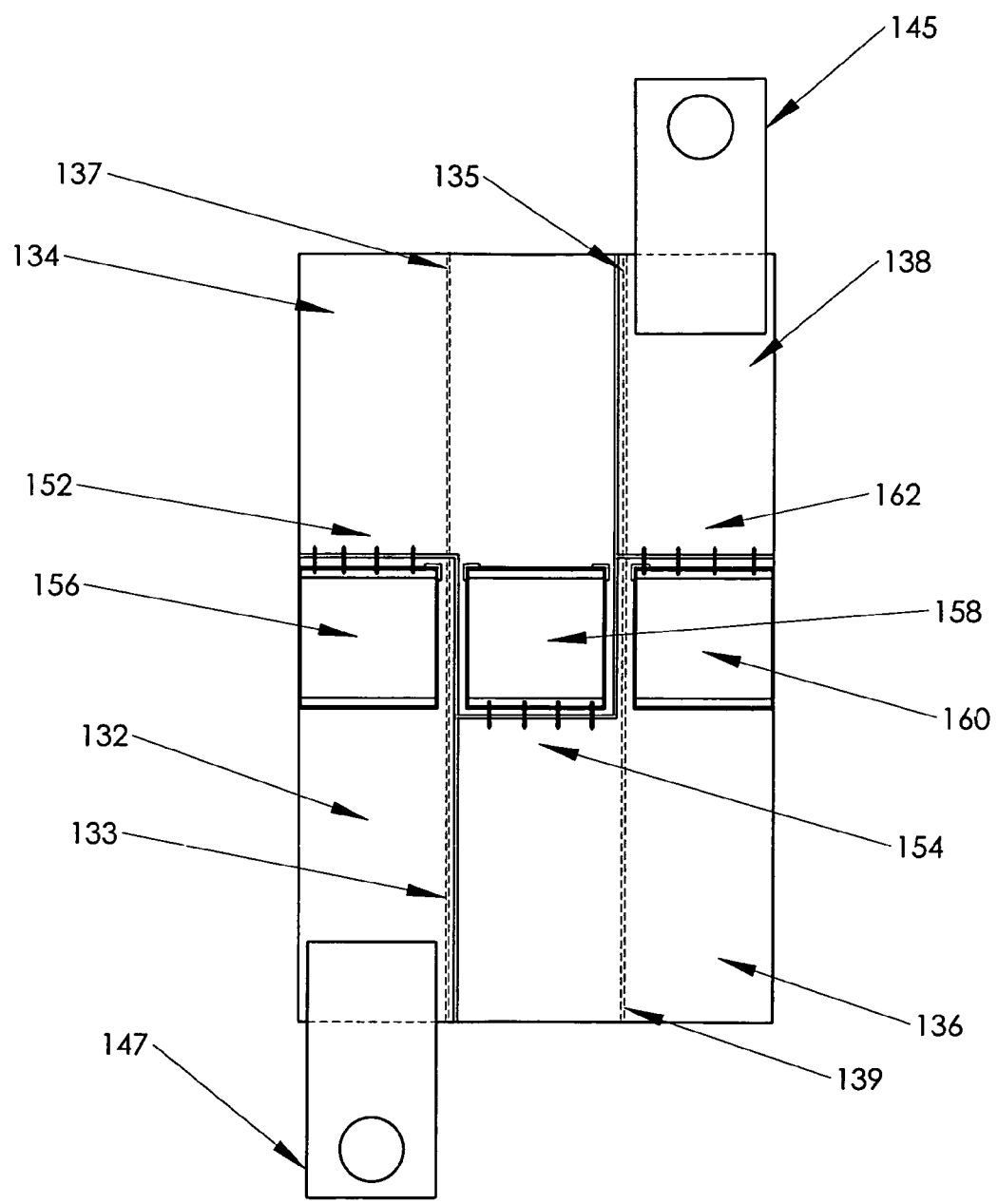
FIG. 1D is a top plan view of the three-section patterned metal substrate with LEDs and interconnects shown of the present invention.

FIG. 1D shows the LEDs mounted by soldering onto the patterned metallized substrate. After the LEDs are attached eutectically, the top contacts (LED anode) are made via wirebonds 152, 154, and 162. This particular configuration shows the wirebonds 152, 154, and 162 connected via a series arrangement wherein a positive voltage is applied to metal island area 132 which extends underneath and contacts the bottom (anode) of the LED 156. The top contact (cathode) of LED 156 is made via the wirebonds 152 to metal island 134, which extends across the fold line 137 and makes contact to the bottom (anode) of LED 158 centered on the bottom (center) of the three-sided recycling light cavity. The top side cathode contact of LED 158 is connected via wirebonds 154 to metal island 136 which extends across the fold line 139 and makes contact to the bottom (anode) of LED 160. The top side contact (cathode) of LED 160 is connected via the wirebonds 162 to metal island 138. This metal island is connected to the negative side of a suitable power supply providing enough voltage and current to drive these LEDs in series. This connection can be by a wire (not shown) soldered to tab 145 soldered to the metal island. Tab 147 soldered to island 132 is similarly connected via a wire to the positive side of the power supply.

Figure 1E:
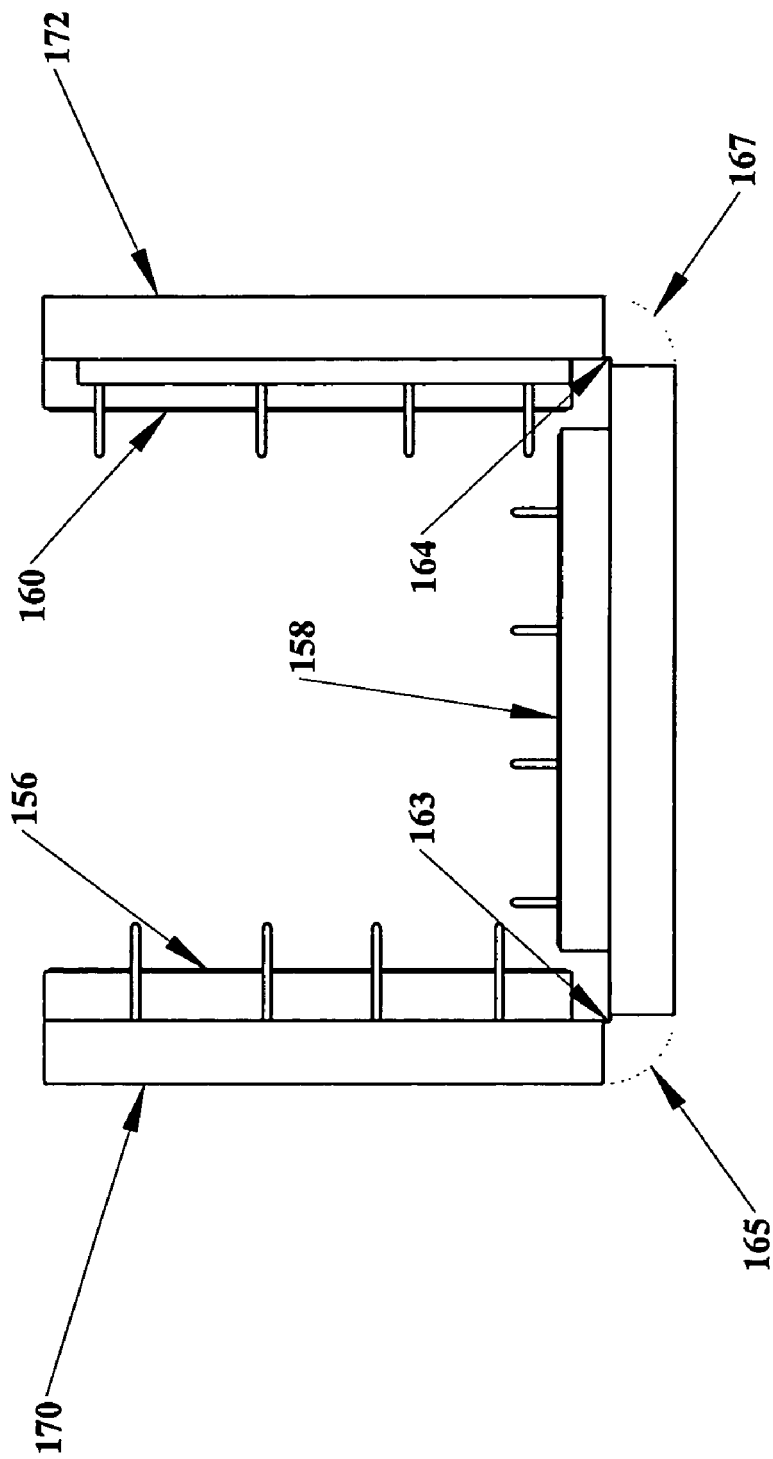
FIG 1E is a cross-sectional view of a three-section patterned metal substrate folded into a three-sided cavity of the present invention.

All of these steps in this assembly process to this point are performed on a planar substrate and, therefore, can utilize conventional high speed pick and place, die attach, wirebond and other such assembly equipment. The metal islands 132, 134, 136, 138 extend across the fold lines 137, 139, however, they are all isolated from each other by the lines 133 and 135 where the metal has been removed by laser or photolithography as previously mentioned. However, metal islands 134 and 136 extend across the fold lines to provide a continuous electrical path from one section (side) to the other section (side). Therefore, this metal layer provides a metal interconnect between LEDs and/or LED arrays inside the light recycling cavity and also acts as a mechanical hinge allowing the left and right side of the cavity to be folded vertically. This metal interconnect and hinge is shown in FIG. 1E where the two sides 170 and 172 have been folded vertically so the two side arrays of LEDs 156 and 160 are now facing each other with the bottom LED 158 (three sides have LEDs) or LED arrays facing up vertically between these sides. This thin metal layer is robust enough to act as a hinge 163, 164 and hold the sides together to form a cavity. Optionally, to electrically isolate the metal hinge from the backside and help mechanically support the hinge, a fillet of cement or adhesive such as silicon rubber, Resbond 989F, etc. may be applied to the joint area 165, 167.

Figure 1F:
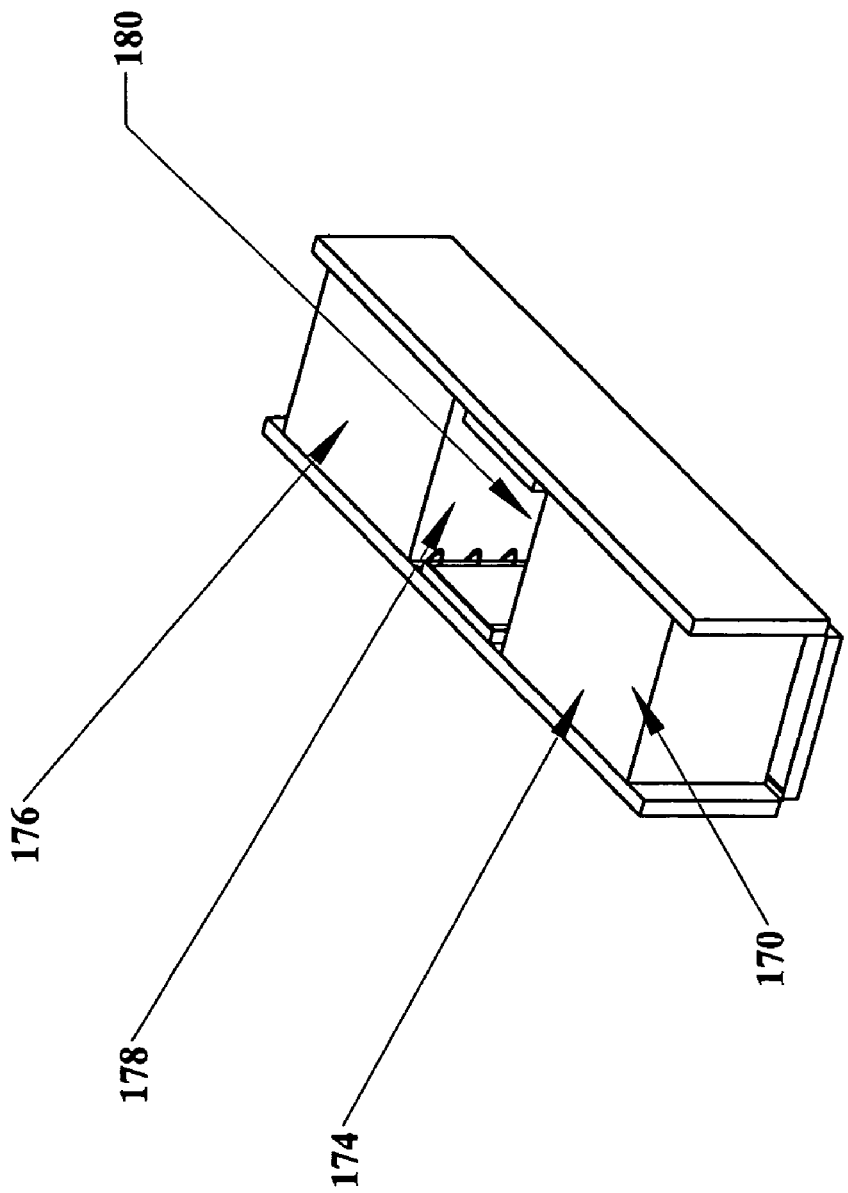
FIG. 1F is a cross-sectional view of a three sided cavity with reflective end caps forming a five-sided cavity of the present invention.

Shown in FIG. 1F is a perspective view of the folded cavity 170. To complete this three-sided light recycling cavity, two highly reflecting end caps 174, 176 fabricated from expanded Teflon and/or highly reflective mirror materials are inserted in the two open ends of the cavity. These end caps form the remaining sides of a five-sided light recycling cavity and also provide mechanical support to the structure, relieving stress on the thin metal hinges. The reflectivity of the interior surfaces 178, 180 of these end caps is higher than 95% preferably higher than 98%. This highly reflective end caps, coupled with high reflectivity LEDs, assure an enhancement in brightness for the LEDs inside the cavity. See, for example, U.S. patent application Ser. Nos. 6,869,206 and 6,960,872. After this process step, the light recycling cavity is fully formed and now only has to be placed into a heatsink.

Figure 1G:
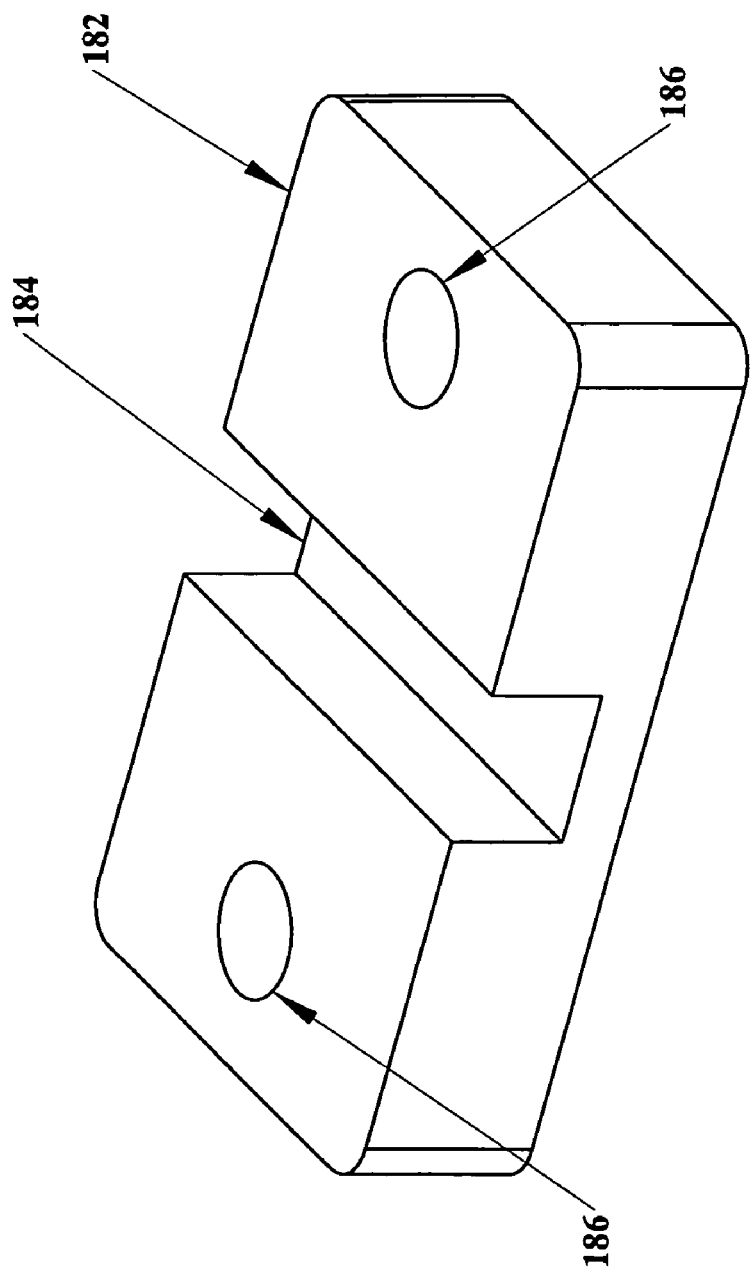
FIG. 1G is a cross-sectional view of a slotted heat spreader of the present invention.
Figure 1H:
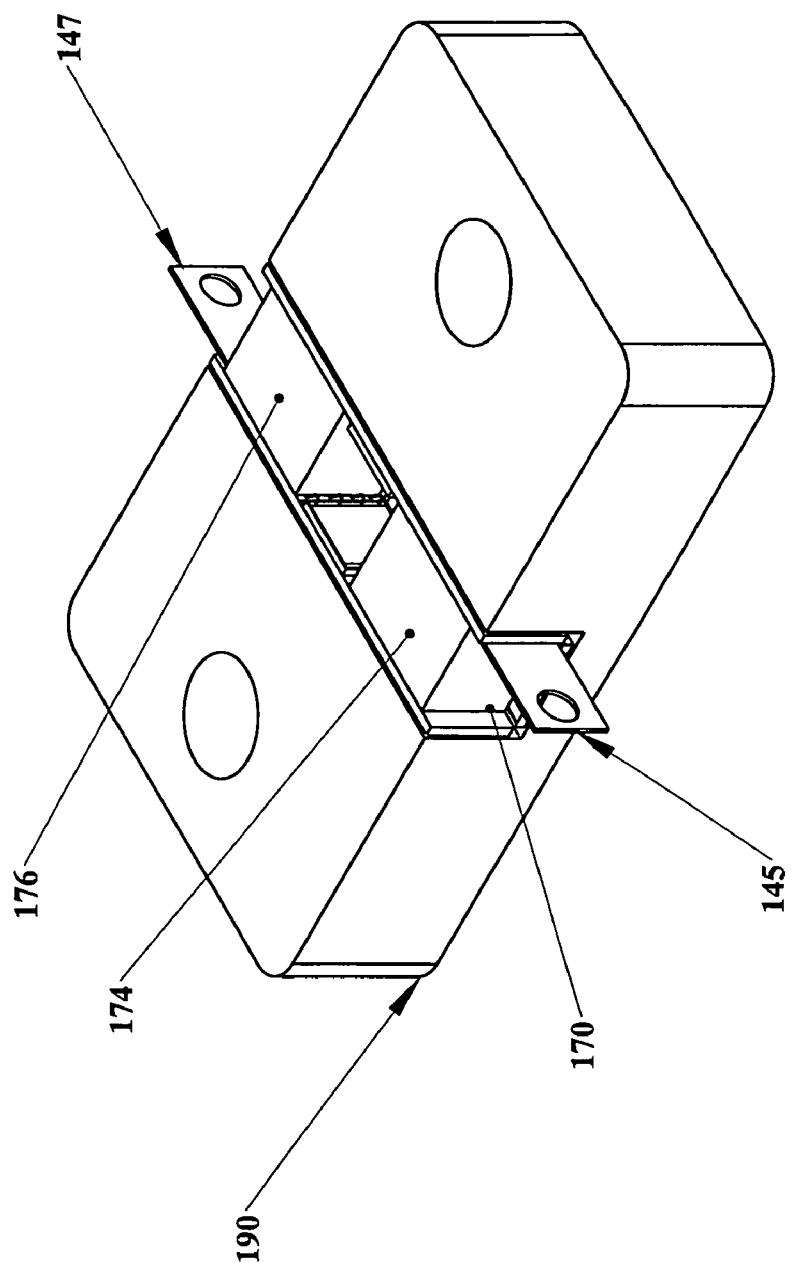
FIG. 1H is a perspective view of the completed three LED faced light recycling cavity of the present invention.

Shown in FIG. 1G is a slotted copper plate 182, which acts as a heat spreader or heatsink. The inside dimensions of the slot 184 match the outside dimensions of the folded cavity 170 shown in FIG. 1F. For example, the width of the slot may be 2 to 2.4 mm wide and the height of the slot may be 2 to 2.4 mm high for a light recycling cavity containing 12 (1 mm×1 mm) LEDs, consisting of 3 arrays of four LEDs (2×2 array with one array per side. The through holes 186 in the slotted copper plate allow the heat spreader 182 to be mounted to a suitable heatsink. Several examples of heatsinks are given in pending U.S. patent application Ser. No. 60/811,310, "Light Emitting Diode Light Source with Heatsink" by William R. Livesay et al. The cavity is inserted into the slot 184 and can be secured by soldering eutectically, utilizing the optional metal coating on the backside of the substrate, to make intimate contact with the three aluminum nitride substrates, as shown in FIG. 1H. A eutectic solder is used that has a lower melting temperature than the one used to mount the LEDs onto the aluminum nitride substrate. For example, Sn96.5/Ag3.5 (221° C.) or Sn/Bi (138° C.). This soldering is done to ensure that the LEDs do not move or lose their alignment to each other in this final fabrication step.

FIG. 1H shows a perspective view of the finished assembly 190 showing the folded cavity 170 with end caps 174, 176. Also shown are two metal tabs 145 and 147 formed from gold, copper, etc. that have been soldered to metal islands 132 and 138 (as shown FIG. 1D). These tabs can be used to connect power to the LEDs as previously described.

This sequence of process steps shows a simple, reliable, and repeatable method for assembling light recycling cavities. This unique approach maintains precise alignment of the LEDs within the light recycling cavity and only requires one additional process step over a process that might be used to form or mount and electrically connect arrays of LEDs on planar substrates. The one additional process step is a simple one, that of scribing, cutting, or sawing the aluminum nitride substrate. This can be done accurately with a diode pumped 266 nm laser using two watts in a 5 μm spot size which will result in a kerf width of approximately 12 μm.

As discussed in the prior art references cited in the "Background" section, light recycling cavities can attain higher intrinsic gain or light amplification by increasing the number of LEDs inside the light recycling cavity. Using a process similar to the one depicted in FIG. 1 which shows a three-sided cavity, a four-sided cavity may be constructed using a few additional steps.

Figure 2A:
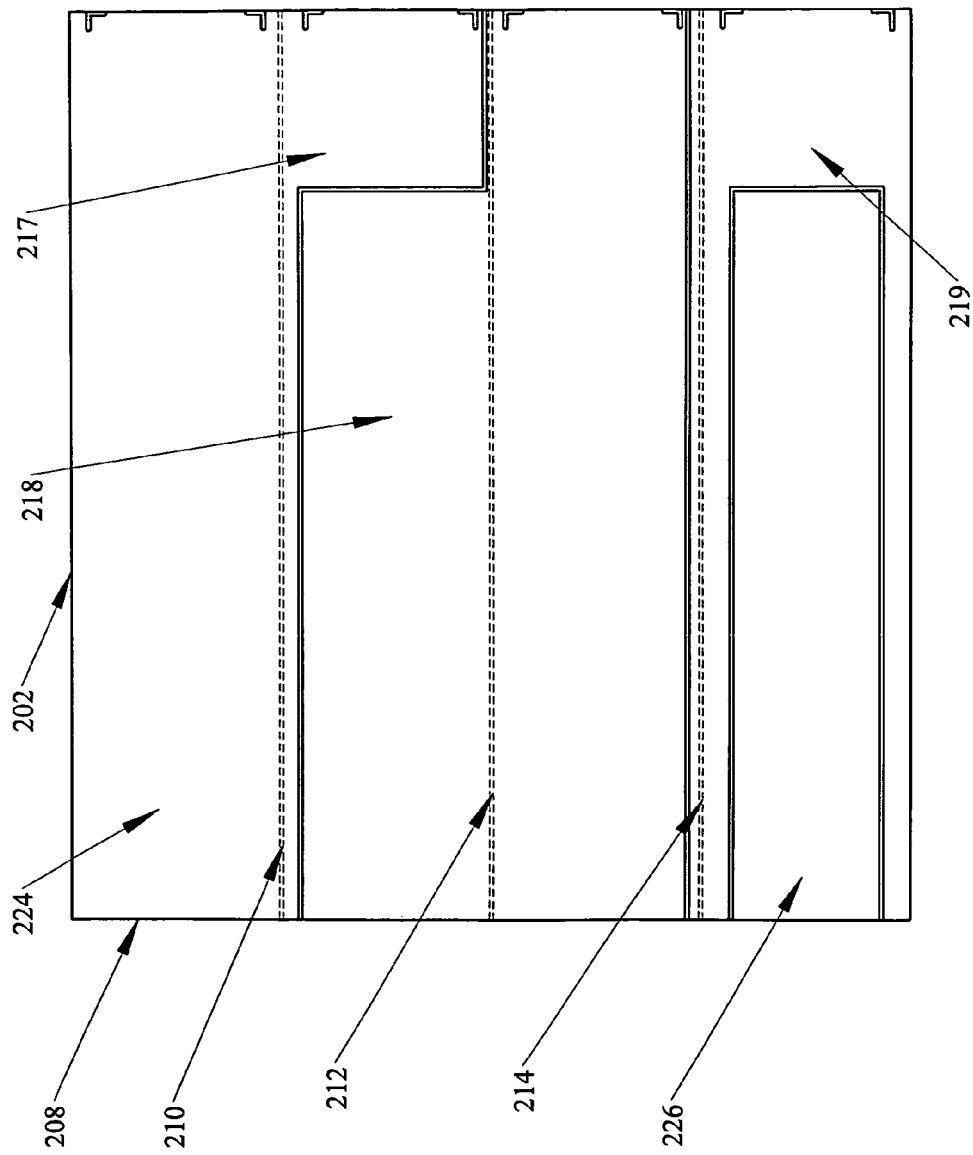
FIG. 2A is a top plan view of a four-section patterned metal coated substrate of the present invention.

FIG. 2A shows the substrate 202 with a patterned metal electrode for a four-sided cavity. The metal is deposited and patterned as previously described, however, instead of three sections for mounting LED arrays, there are four sections 208 and three fold lines 210, 212, 214 which, when folded, become the four sides of a four-sided cavity. As can be seen in FIG. 2A, the patterned gold forms metal islands 224, 217, 218, 219, 226 to interconnect the LEDs to be mounted such that each LED array or LED or each side is connected in series. The output of this four-sided cavity would be as shown by the arrow 220. The metal islands are shortened on this output side to move the LEDs next to the output aperture of the completed cavity.

Figure 2B:
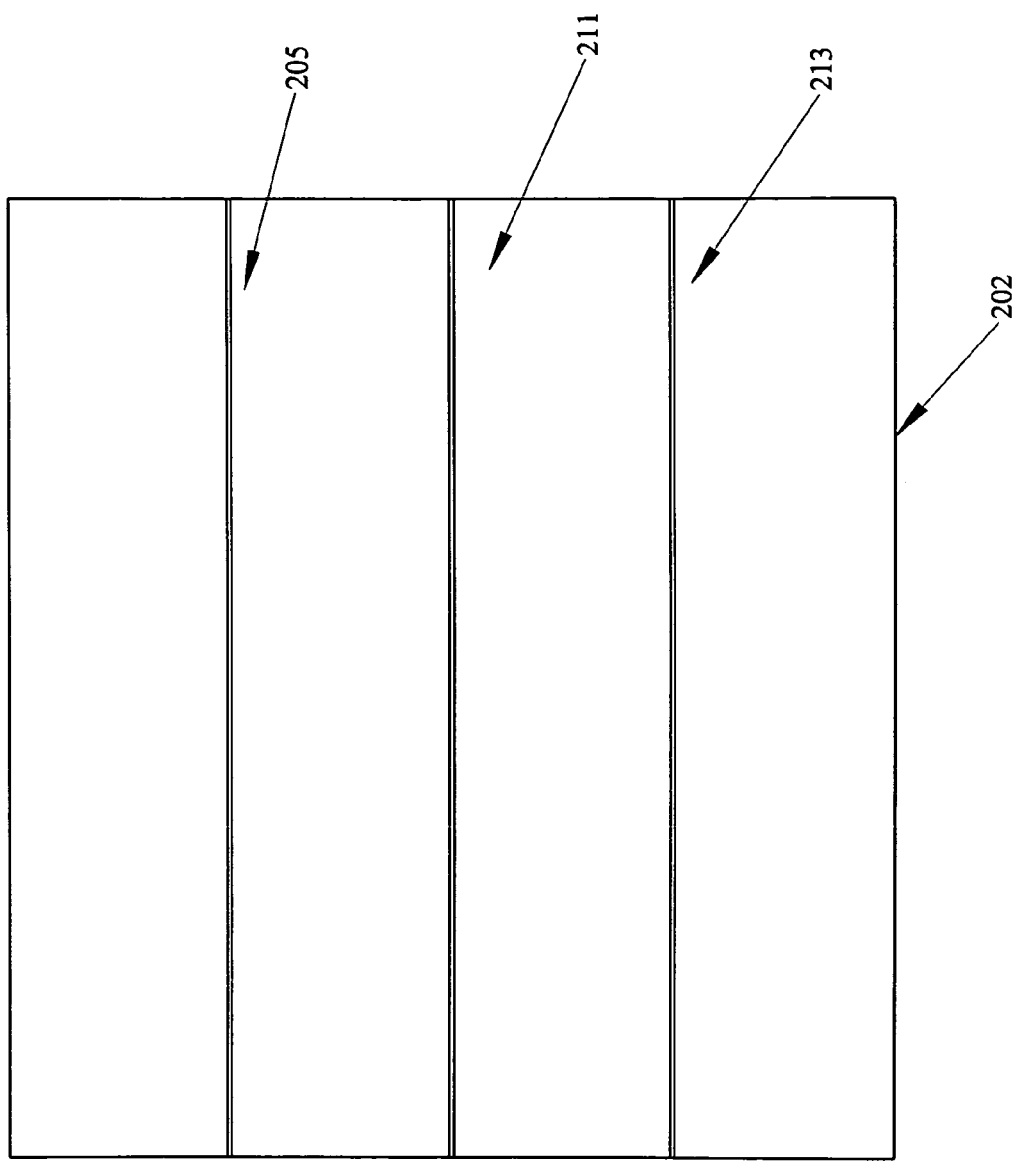
FIG. 2B is a bottom view of a four-section metal coated substrate with cut grooves of the present invention.

Referring to FIG. 2B, the substrate 202 is cut on the backside (opposite side from the patterned metal) creating three channels 205, 211, 213 that allow the assembly to be folded. The LEDs are mounted and wirebonded using the process described previously and depicted in FIG. 1.

Figure 2C:
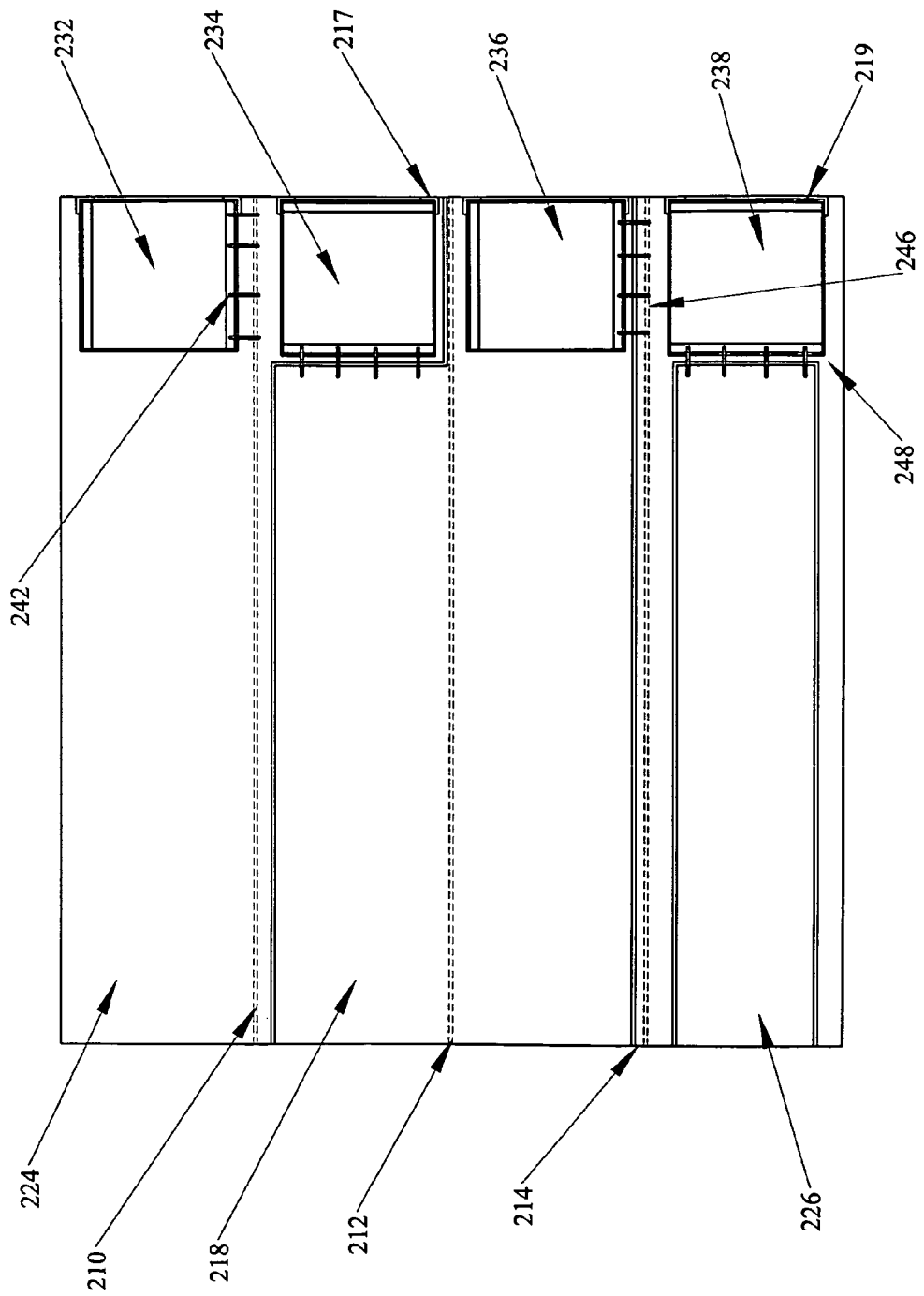
FIG. 2C is a top plan view of a four-section metal coated substrate with LEDs and interconnects shown of the present invention.

A different interconnect arrangement is shown in FIG. 2C to facilitate lining up the LEDs to the edge of the substrate, which will become the output edge of the cavity. The connection to an external power supply (positive terminal) to power this cavity is made through the metal island 224, which contacts the bottom (anode) of LED 232.

The top contact (cathode) of LED 232 makes contact to electrode 217 through wirebonds 242. The metal island 217 extends across the fold line 210 and under LED 234 to make contact to the anode of LED 234. The top contact (cathode) of LED 234 makes contact to the metal island 218 through the wirebonds 244. Metal island 218 extends across the fold line 212 and under LED 236 to make contact to the anode of LED 236. The top contact (cathode) of LED 236 makes contact to metal island (electrode) 219 through wirebonds 246. The wirebonds 246 make contact to metal island 219 to the left side of the fold line 214. This is also done with wirebonds 242 to metal island 217. This orientation keeps the wirebonds from getting bent when the cavity is folded. The top contact (cathode) of LED 238 makes contact to metal island 226 through the wirebonds 248. The negative polarity terminal of the power supply is applied by soldering a wire or metal tab to metal island 226. The placement of wirebonds 242 and 246 are novel in that when the cavity is folded, a portion of the wirebonds are hidden from the active part of the cavity as shown in FIG. 2D.

Figure 2D:
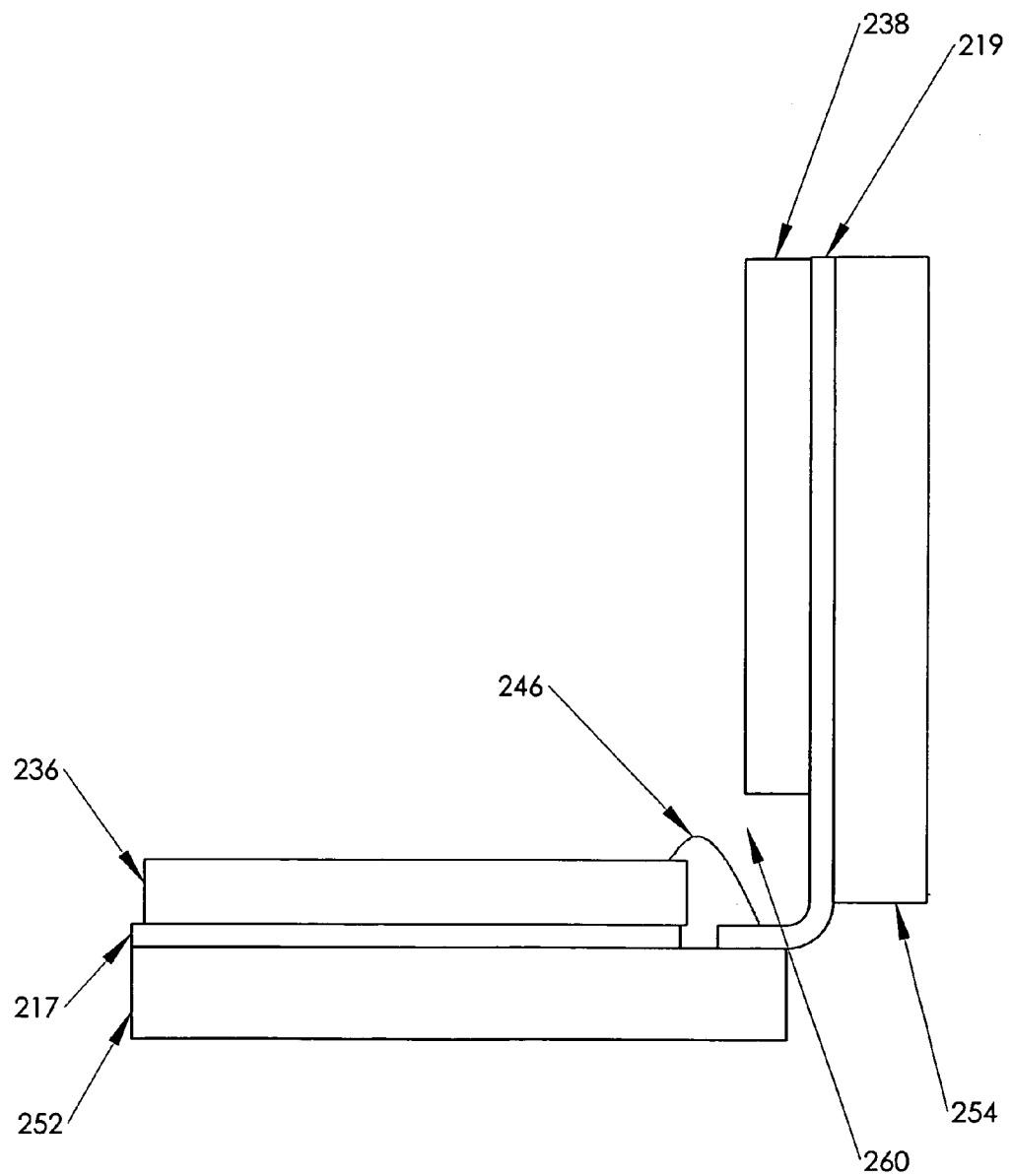
FIG. 2D is a cross-sectional view showing the detail of one folded corner of the four-section (sided) cavity of the present invention.

Shown in FIG. 2D is a cross-section (for illustrative purposes, not to scale) of the two sides of the cavity 252, 254 showing how the interconnect is made between LED 236 and LED 238. LED 236 is attached to substrate 252 through metal island 217. The top contact (cathode) of LED 236 is connected to the patterned metal island 219, which is attached to substrate 252 and to substrate 254. This top contact connection is made via wirebond 246. As shown in this figure, metal island 219 runs from just outside LED 236 and runs across and underneath LED 238 making contact to the anode of LED 238. A portion of the wirebond 246 is hidden from the rest of the cavity in area 260 formed when the cavity is folded. This area is defined by the thickness of the LEDs, which can vary from 50 microns to 300-400 microns. For current high brightness LEDs, the LED thickness is approximately 100 microns. One advantage of this interconnect method is that the gold wire which is typically used to make the wirebonds is not highly reflective for blue and green wavelengths and, therefore, obscuring a portion of the gold wire from the light recycling cavity enhances the overall efficiency of the cavity.

Figure 2E:
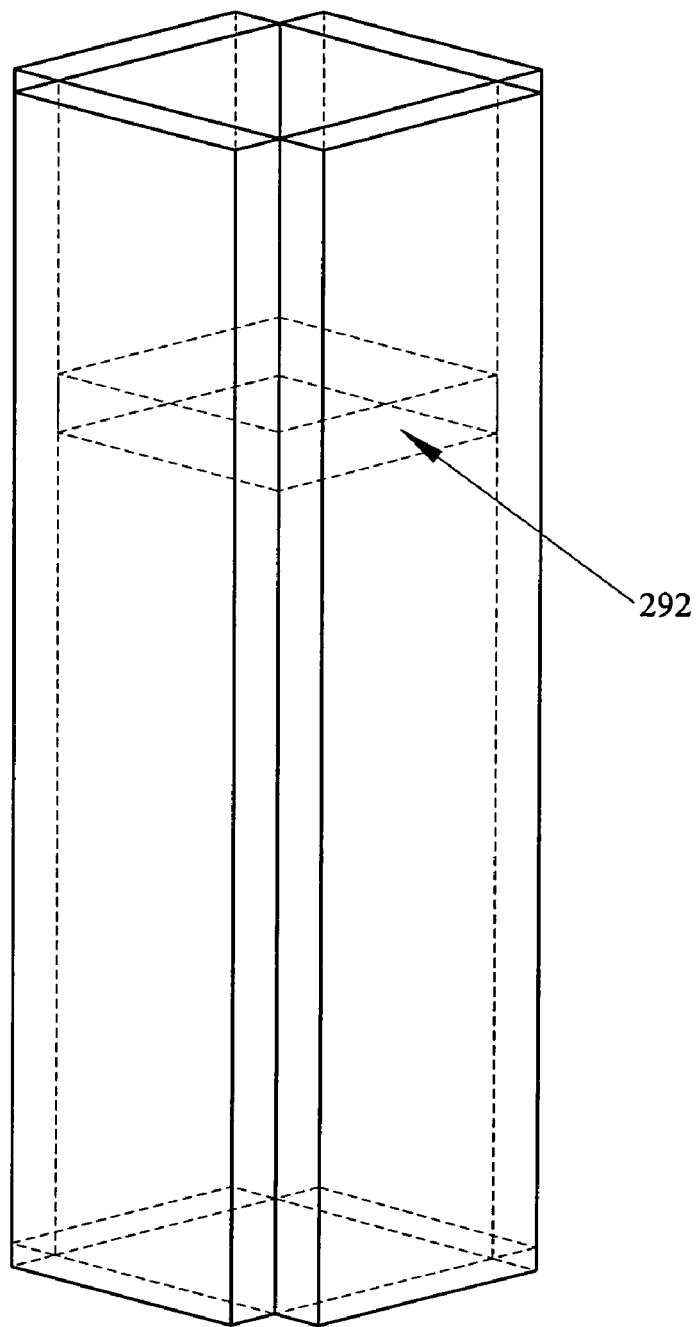
FIG. 2E is a simple perspective view of the folded four-sided cavity of the present invention.

The folded version of this four-sided cavity is shown in a simplified perspective view in FIG. 2E. To complete this cavity, a bottom, highly reflective end cap 292 similar to ones previously described (see FIG. 1F) is placed at the bottom of the light recycling cavity.

Figure 3A:
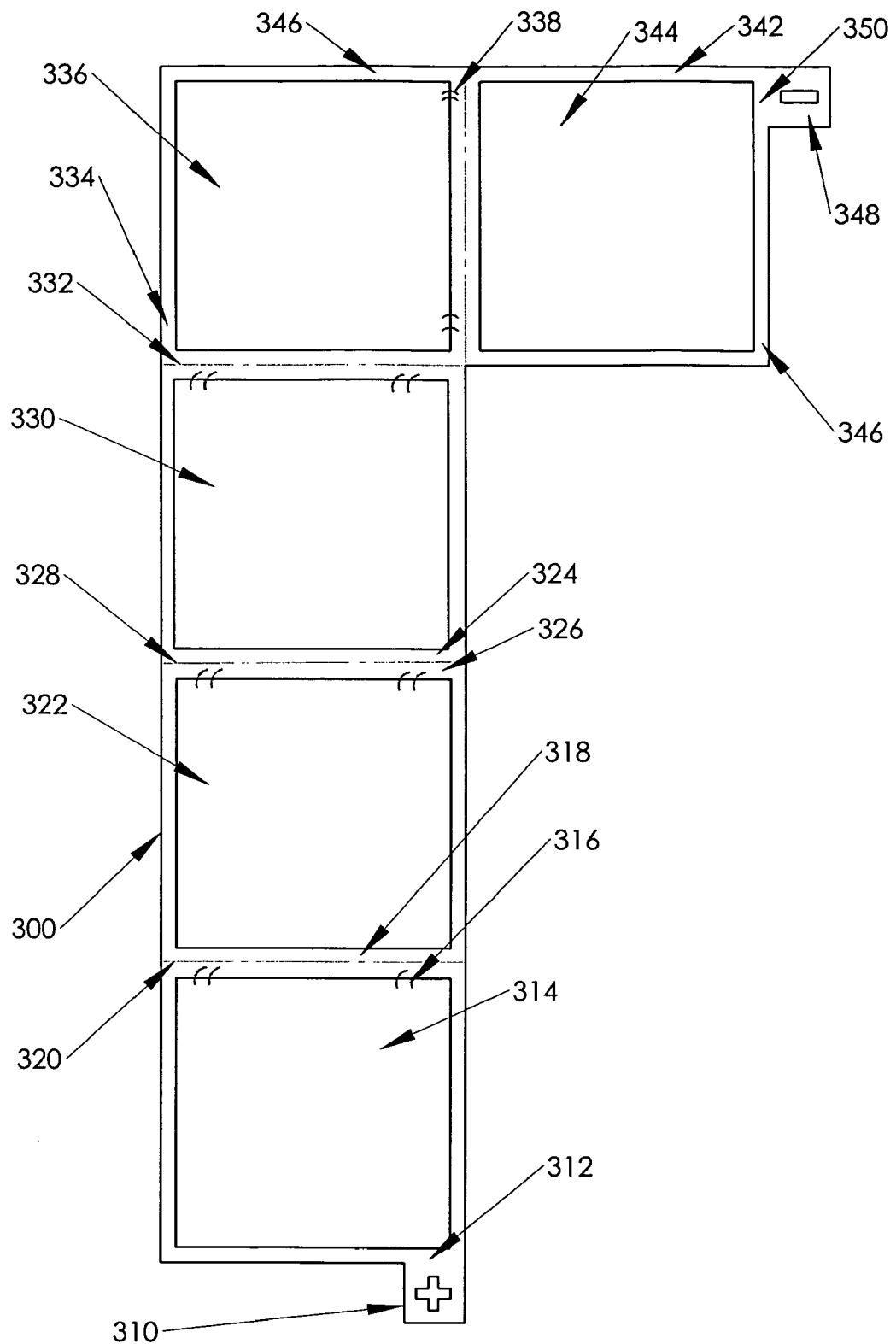
FIG. 3A is a plan view of an unfolded five-sided LED light recycling cavity of the present invention.

A five-sided cavity can be constructed using the process steps previous described with one additional section and fold to form the bottom of the cavity. A planar substrate 300 is shown in FIG. 3A for fabricating a five-sided cavity. Also shown are LEDs mounted and wirebond connections to show the interconnect method for this cavity. The process for fabricating the substrate, metallizing, patterning the metal, scribing the substrate, performing die attach and wirebonding have all been described previously. For this five-sided cavity, the interconnect between the LEDs on each side is in a series arrangement.

Figure 3B:
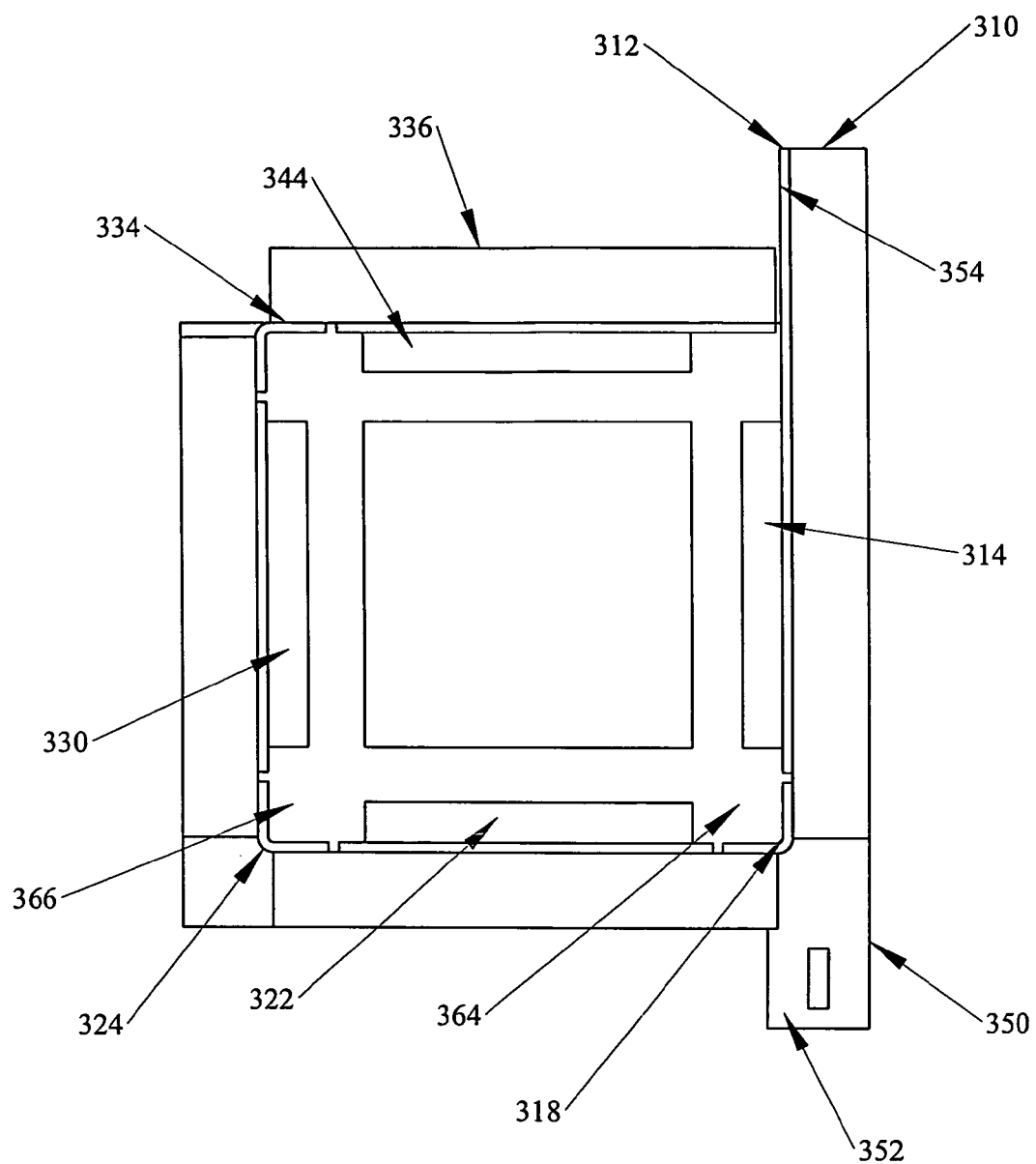
FIG. 3B is a top view of a folded five-sided cavity showing the interconnect detail of the present invention.

It is instructive in describing the interconnect method of this five-sided cavity to refer to FIGS. 3A and 3B in the description that follows. For clarity, single LEDs are used to cover each side, however, multiple LED arrays may be used for each side. FIG. 3A shows the five-sided cavity before it is folded while still in a planar arrangement. FIG. 3B shows the five-sided cavity after it is folded with a top view shown looking down inside the cavity from the open end. Referring to FIG. 3A, a positive polarity connection is made to tab 310, which is connected or optionally part of metal island 312, which makes contact to the bottom (anode) of LED 314.

The top contact (cathode) of LED 314 is connected via wirebonds 316 to metal island 318 which extends across fold line 320 and underneath LED 322 to make contact to the bottom anode of LED 322. The top contact of LED 322 is connected to metal island 324 via the wirebonds 326. The metal island 324 extends across the fold line 328 and underneath LED 330 to make contact to the bottom anode of LED 330. The top contact of LED 330 is connected via wirebonds 332 to metal island 334 which runs underneath LED 336 making contact to the bottom anode of LED 336. The top contact of LED 336 makes contact to the metal island 338 via wirebonds 340. In this case, this connection is at right angles to the other in-line connections of the four sides of the cavity, as the tab 342 is hinged off the metal island 338 to form the bottom of the cavity.

Figure 3C:
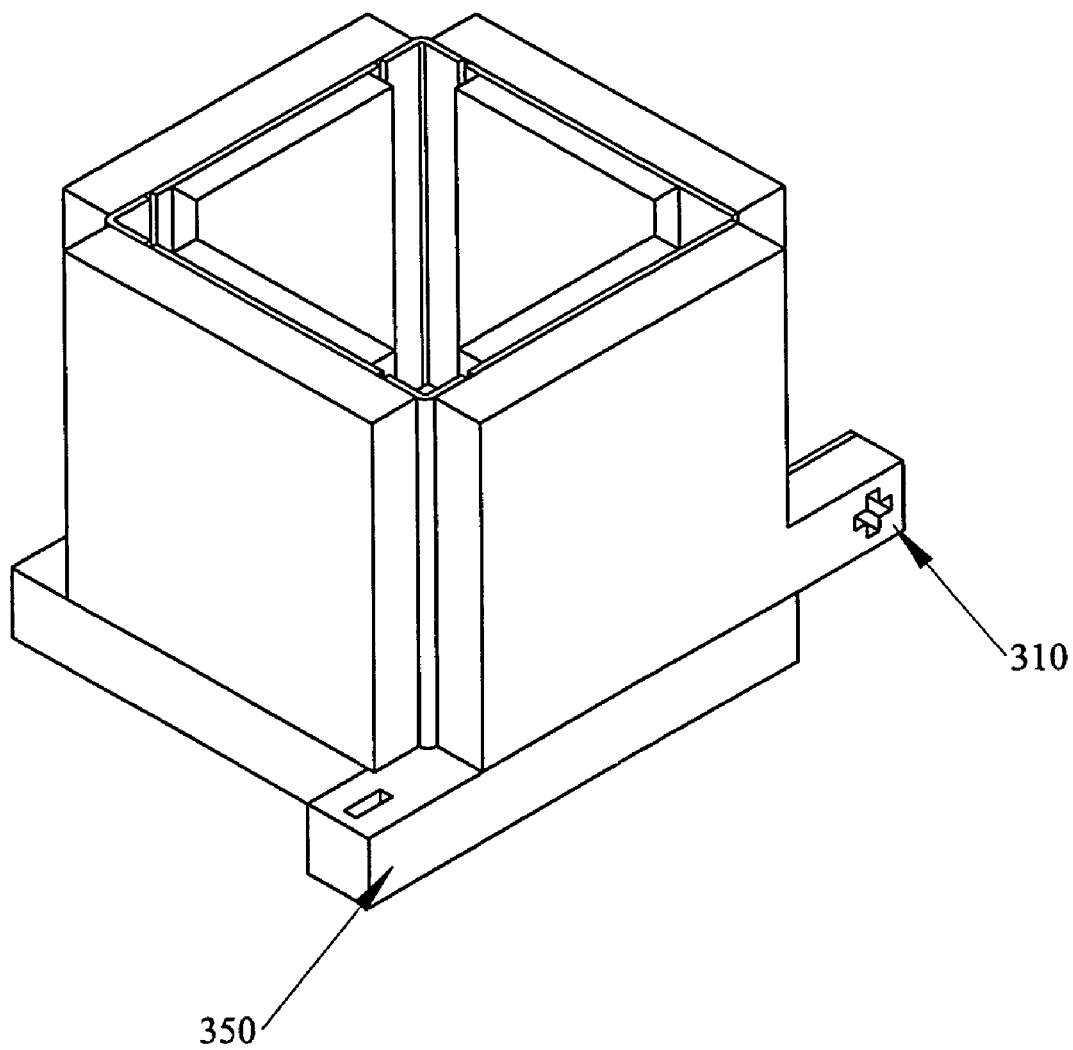
FIG. 3C is a simple perspective view of the folded five-sided cavity with interconnect tabs.

Metal island 338 contacts the bottom anode of LED 344. Wirebonds 346 connect the top contact of LED 344 to the metal island 348. Metal island 348 extends out on tab 350 to enable electrical contact to be made to the inside of the folded five-sided cavity. This arrangement is shown in FIG. 3B and FIG. 3C which depicts the five-sided cavity folded with tab 350 and tab 310. A wire 352 may be soldered to the metal island 348 on tab 350. The positive polarity connection is made on wire 354 which is soldered to metal island 312 and sticking out on tab 310. In this configuration, the electrical connections to the chain of LEDs is made at 310 and 350.

These are extra tabs, which are sticking out beyond the flap 320, that forms the bottom of the cavity and the sides. In this arrangement, five-sided cavity wirebonds are made to an isolated island, which connects the next die in series. The wirebonds made from the top of the first die make connection to the bottom of the second die so that when folded the wirebonds are partially hidden by the cavity 364, 366, etc. formed by the edges of the die (as shown in FIG. 3B). This connection arrangement allows the die to be placed with their edges right at the edge 293 of the output aperture of the cavity, at least for the four side arrays. Practicing this invention, one skilled in the art can mix these elements to configure any number of combinations of light recycling cavities.

Figure 4A:
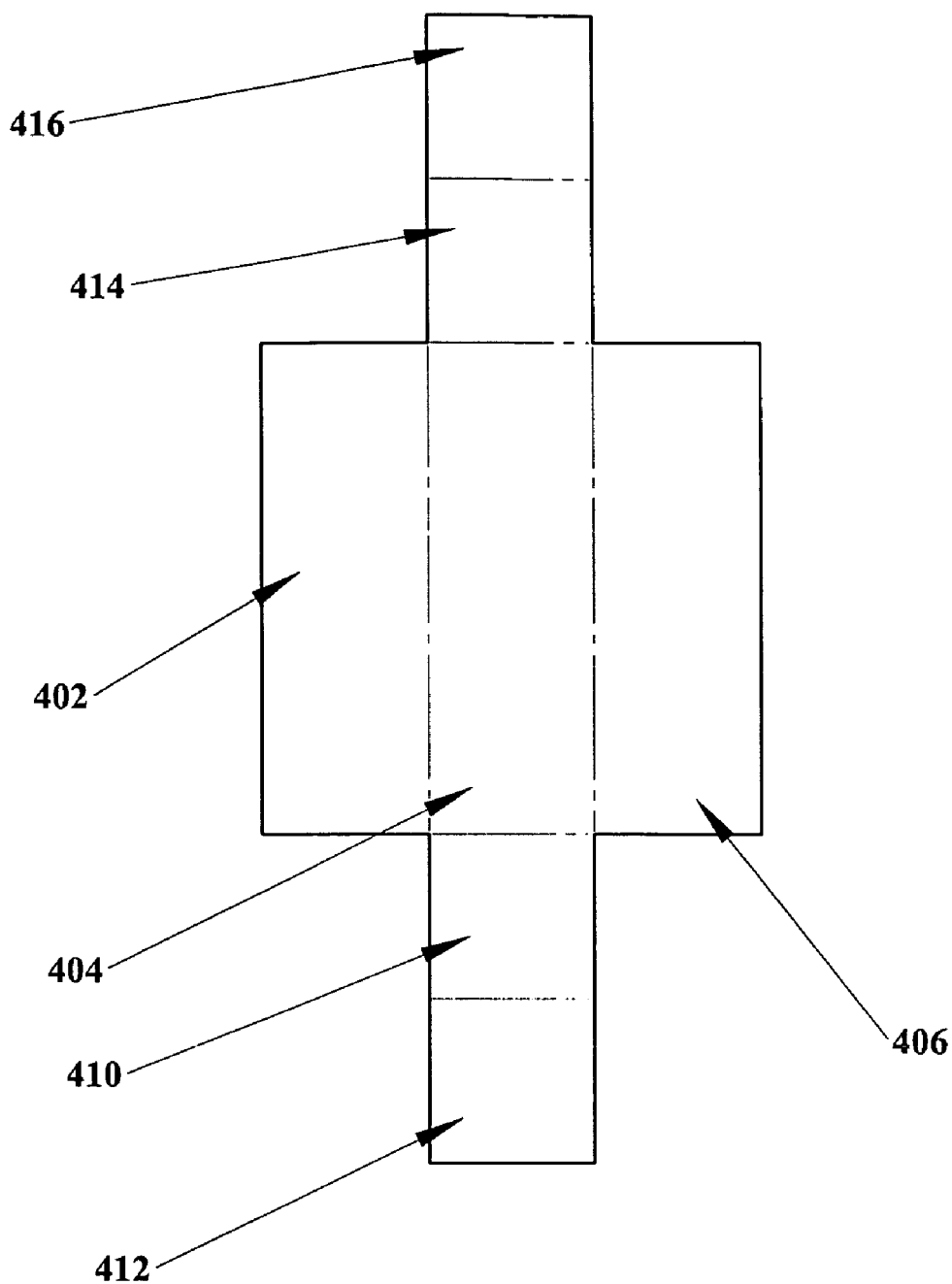
FIG. 4A is a top plan view showing an alternate method to form end caps for a three-sided cavity of the present invention.
Figure 4B:
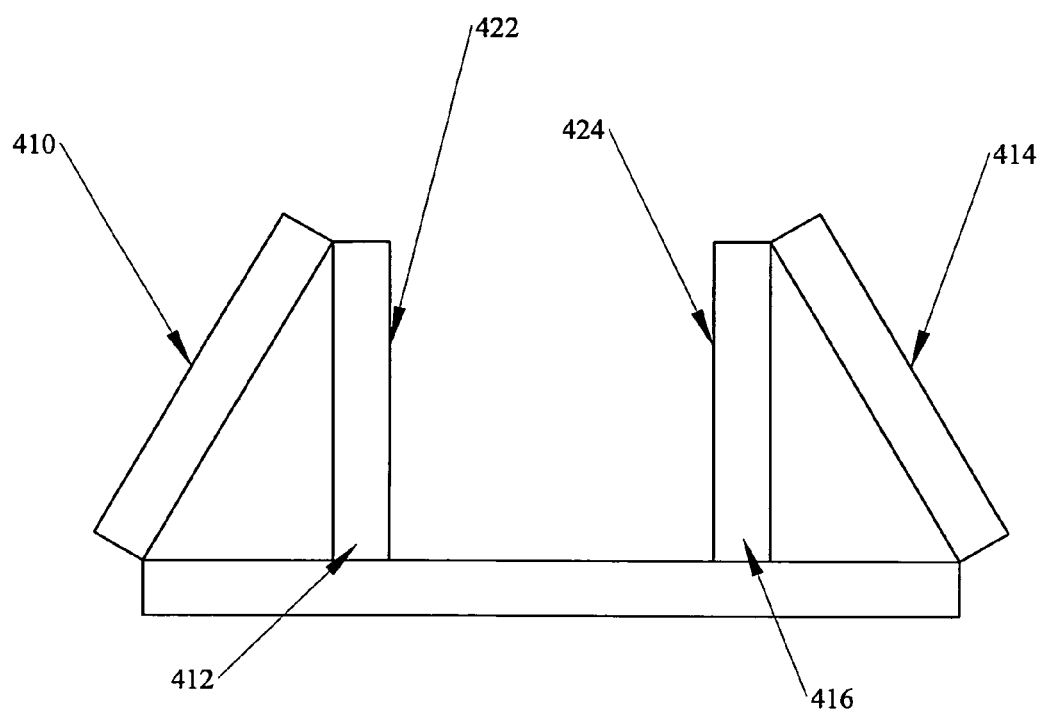
FIG. 4B is a cross-sectional view showing extra tabs forming end caps when folded of the present invention.

Another embodiment of this invention incorporates additional flaps, which provide an easily constructed three-sided cavity with end caps as shown in FIG. 4A and 4B. FIG. 4A shows a three-section 402, 404, 406 substrate similar to FIG. 1A. However, the center section 404, which will form the bottom of the cavity, has two extra flaps 410 which is connected to 412, and 414 which is connected to 416. Metal islands are patterned and deposited as previously described, however, an extra process step is added wherein the bottom of the cavity has a mirror coating of dielectric, protected silver, etc. deposited via sputter, evaporation, and/or electroplating.

Figure 4C:
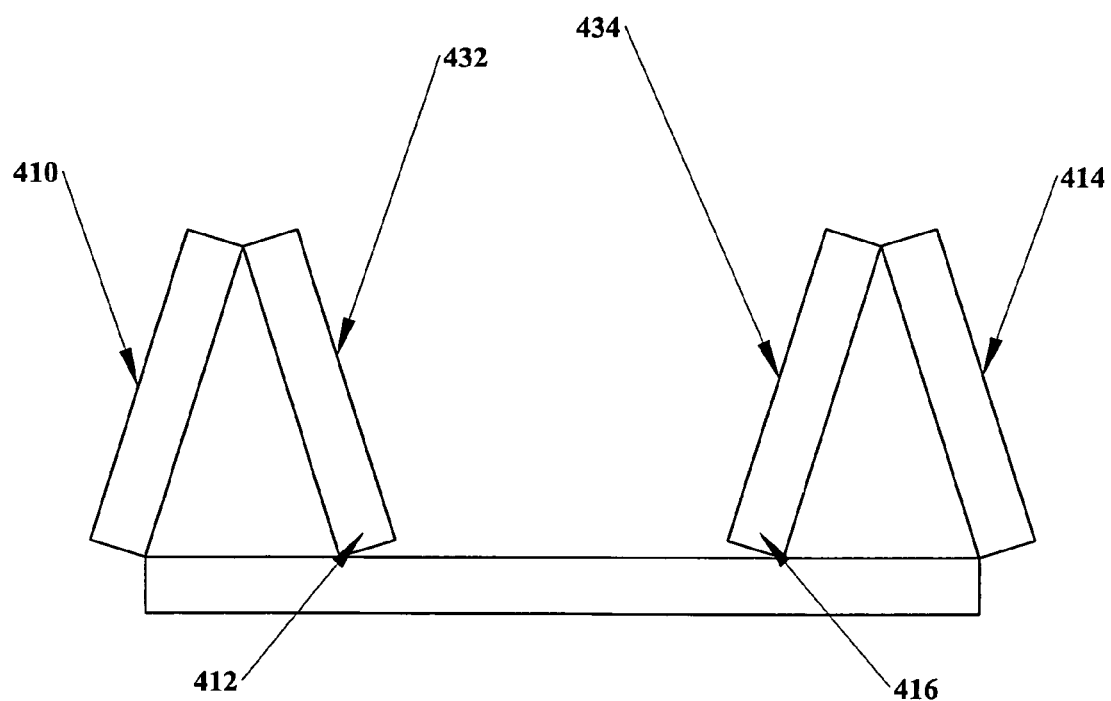
FIG. 4C is a cross-sectional view of the extra flaps forming a tapered mirrored end caps of the present invention.

Shown in FIG. 4B is a cross-sectional view showing just end flaps 410, 412, 414, and 416 folded. The end flaps 410, 412, 414, 416 when folded will form a mirrored inside surface to both inside ends of the cavity. The mirrored surfaces 422 and 424, which were on the bottom of the substrate, after folding, will form the inside mirrored ends replacing the end caps shown in FIG. 1F. This makes forming the end cap simple and self-aligning. The folding can be done to form either a vertical mirrored surface 422 and 424 in FIG. 4B, or a tapered mirrored surface 432, 434, as shown in FIG. 4C.

The heretofore examples of the embodiments of the invention were shown using single LEDs per side or section to more clearly illustrate the invention. However, for some light source applications multiple LEDs may be required for each side of the cavity to achieve higher output. By suitable patterning of the metal islands shown in FIGS. 1, 2, and 3, one skilled in the art can attach and connect multiple LEDs or arrays of LEDs in series or in parallel arrangement in place of the single LEDs shown in these drawings. This will permit large recycling light cavities to be made for very high light output applications.

Multiple LEDs and a different method of implementing the folding cavity including connecting elements and insertion into a copper clad PCBT heatsink is shown in FIGS. 5A through 5G. In the previous examples, the hinge forming the foldable cavity is located on the substrate or submount, typically aluminum nitride, on which the LEDs are bonded. However, to provide convenient external connection to the LEDs and interconnected bond pads on the substrate, another means of constructing the foldable cavity is preferred. In this method, a foldable flexible circuit is mounted to the substrate. The flexible circuit is made by coating an insulating plastic film, such as polyimide (Kapton), Mylar, etc. with metal such as copper, gold, etc.. The metal is etched in a pattern to form interconnects to the appropriate locations. In this embodiment, the flexible circuit contains the hinge, not the substrate.

Figure 5A:
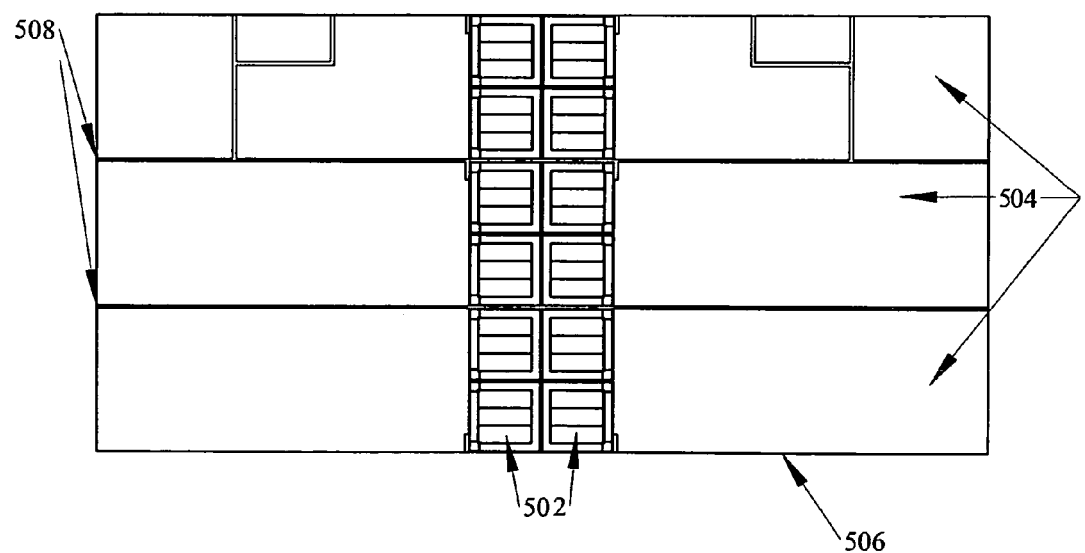
FIG. 5A is a top view of scribed unfolded substrate with LEDs attached of the present invention.

Referring to FIG. 5A, the LEDs 502 are first bonded by soldering or epoxying to the metal pads 506 of the substrate 504. The metal pads can be gold, copper, etc. There is no metallization forming a hinge across the scribe lines 508 on the substrate, as shown in the previous embodiments.

Figure 5B:
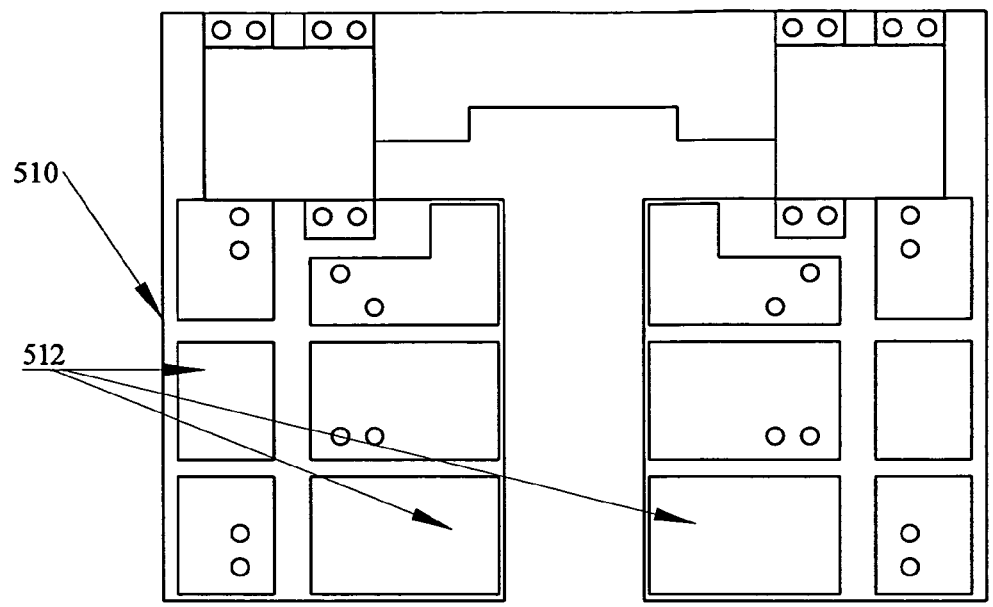
FIG. 5B is a perspective view showing the flex circuit overlay and substrate prior to attachment of the present invention.
Figure 5B:
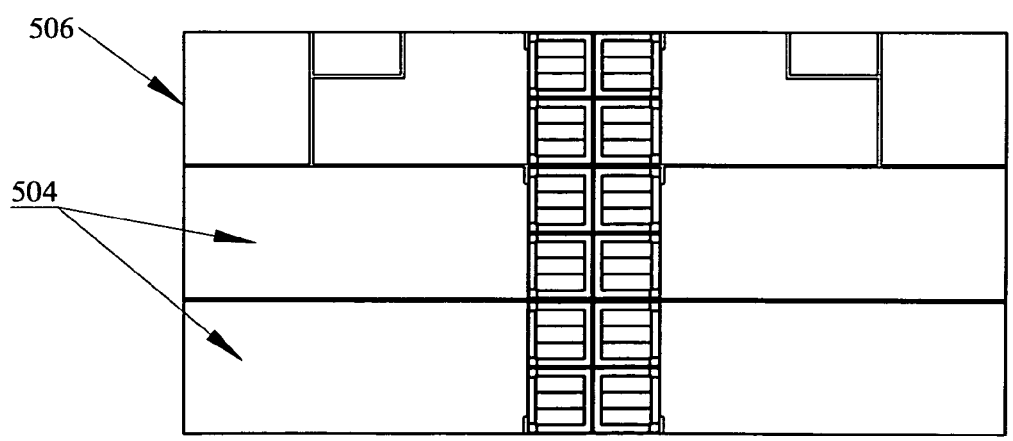

A flex circuit 510 in FIG. 5B is attached via solder or epoxy to the substrate 506. The bottom of the flex circuit has metal pads 512 that make contact and are soldered to corresponding metal pads 504 on the substrate 506. In this view, for clarity, the printed circuit on the top of the flex circuit dielectric is not shown.

Figure 5C:
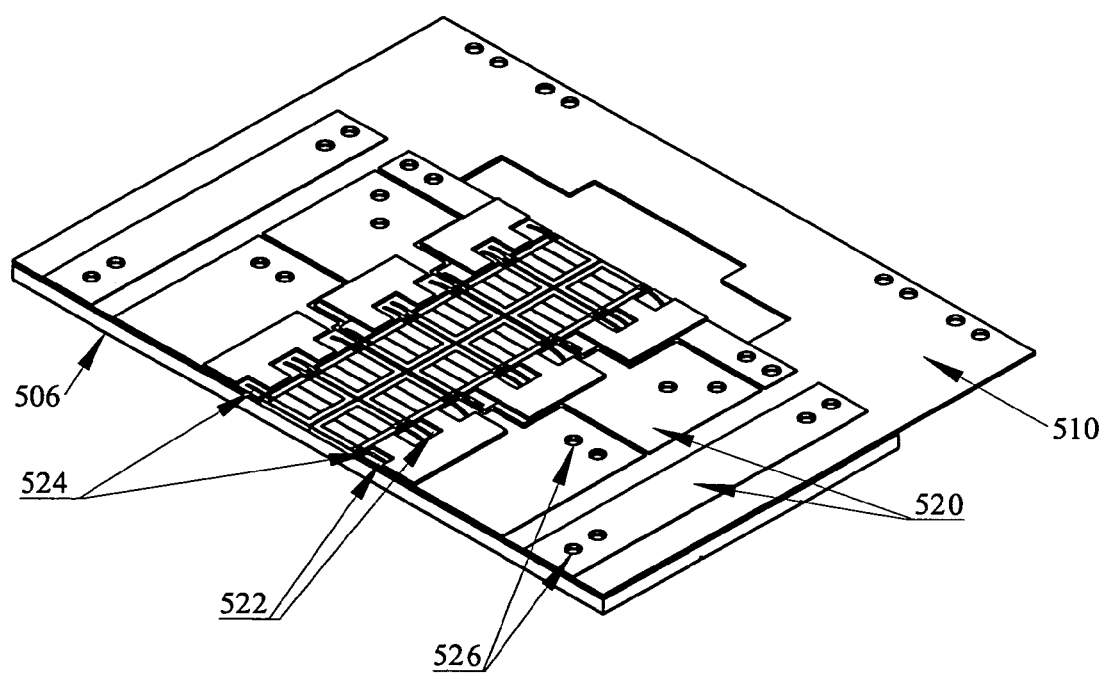
FIG. 5C is a perspective view showing the flex circuit attached to the three section substrate of the present invention.

In FIG. 5C, the flex circuit 510 is shown bonded to the substrate 506. In this view, the printed circuit on the top of the flex circuit dielectric is shown. The topside patterned copper circuit 520 of the flex circuit shown is connected to the LED bond pads 522 by wire bonds 524. The bond pads 522 (cathode connection) on top of the LEDs interconnect to the top metal circuit 520 and by vias 526 through holes in the dielectric of the flex circuit to the adjacent LED anode connections through the metal pads 504 on the substrate 506 which are connected to the bottom of the LEDs. The flex circuit is scribed, for example by a laser, from the bottom side for the two folds that will form the cavity. These scribe lines are located so that they superimpose over the scribe lines in the substrate. The top layer metal conductor on the flex circuit spans across the scribe lines in the flex circuit. The thickness of this flex circuit is selected such that it matches the height and thickness of the LEDs that are mounted on the substrate. This thickness matching allows the cavity to be folded with a hinge that is located at the top emitting face of the LED. Any lateral displacement of adjacent LED edges is minimized when the cavity is folded.

Figure 5D:
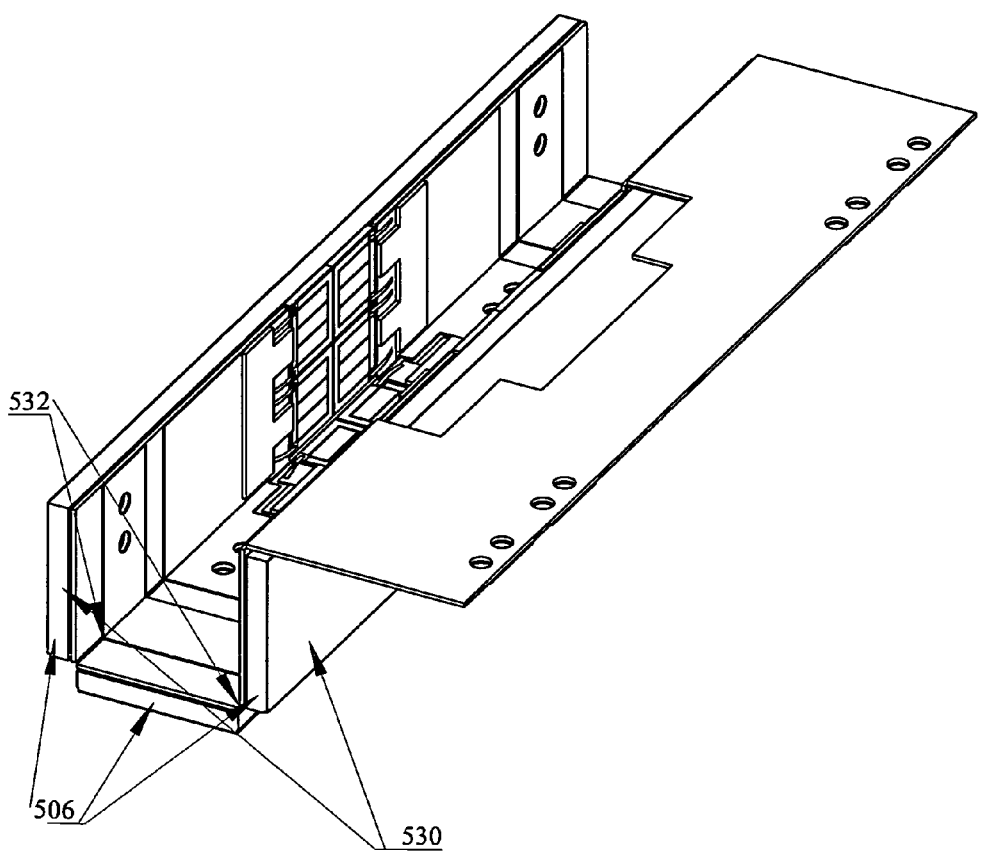
FIG. 5D is a perspective view of the folded cavity on the flex circuit of the present invention.

Once the flex circuit is attached to the substrate and, prior to folding, wire bond interconnects are made between the LED cathode bond pads and the flex circuit top metal interconnect. The flex circuit can now be folded forming the three sides of the recycling light cavity, as shown in FIG. 5D. The two sides 530 of the cavity fold on the hinges 532 formed by the top metal on the flex circuit. The top metal is preferably a ductile metal, such as gold, copper, etc., and preferably between 5 to 25 microns thick. When the fold is made, the substrates 506, typically aluminum nitride, beryllium oxide, alumina, copper, etc., break apart on their previously scribed lines and the bottom and sides fold on the hinge 532 formed by the top metal on the flex circuit.

Figure 5E:
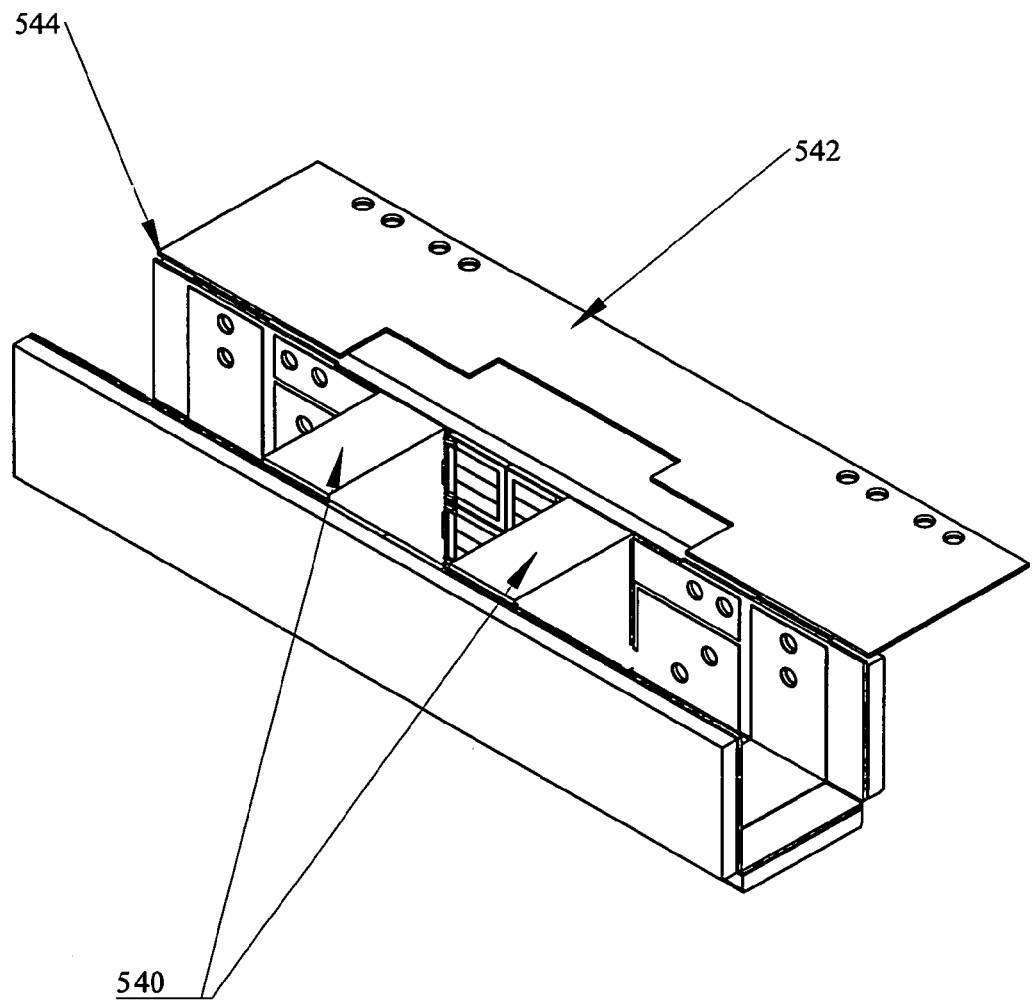
FIG. 5E is a perspective view showing the folded cavity with end caps of the present invention.

To complete the cavity, two reflective end caps 540 are placed so as to close up the two open ends of the cavity as shown in FIG. 5E. To complete external connections, the flexible circuit extends 542 above and outward from the folded cavity and is scribed along the top edge of the cavity. This scribe is done from the topside 544 of the flex circuit. The bottom conductor on the flex circuit, therefore, forms a hinge and also carries the electrical connection to the external circuit and connector.

Figure 5F:
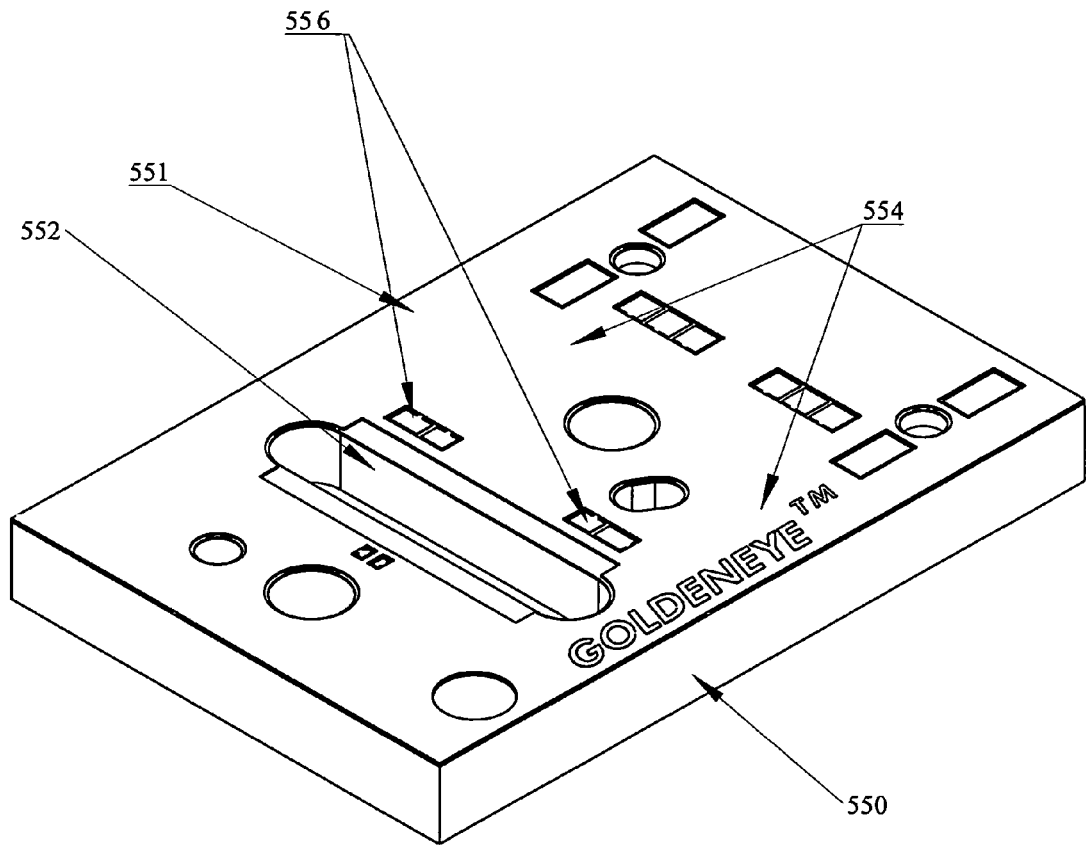
FIG. 5F is a perspective view showing the copper clad PCB with milled slot of the present invention.

A thick copper 550 clad printed circuit board 551 in FIG. 5F with a milled slot 552 acts as a receptacle for the folded cavity and also acts as a heatsink and heat spreader for the light source. The patterned circuit 554 on the top of the PCB and pads 556 interconnect to matching pads on the bottom of the flex circuit.

Figure 5G:
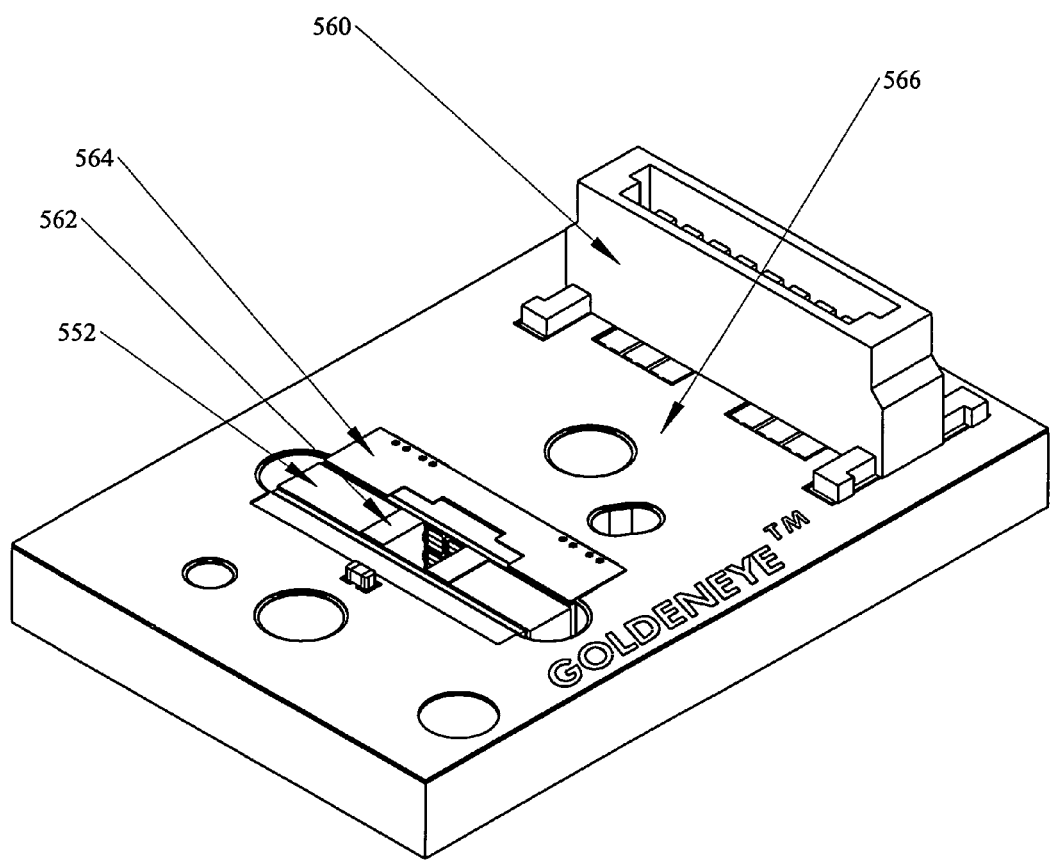
FIG. 5G is a perspective view showing the completed folded recycling light cavity in the PCB heatsink of the present invention.

Referring to FIG. 5G, an external connector 560 is soldered to the clad PCB to provide external connections, such as power connections, to the LEDs in the light recycling cavity. The recycling light cavity 562 is inserted into the milled slot 552 in the copper clad PCB and soldered or epoxied into place. The final and completed connections are made by attaching the folded (at 90°) extended portion 564 of the flex circuit onto the matching interconnect pads 556 on the top of the copper clad PC board 570. This bond can be made either via solder, conductive epoxy, etc.

As can be seen from this invention, multiple combinations of these elements can be constructed using the basic premise of the invention. The method is elegant and simple and provides for high speed, high volume manufacturing on planar substrates and arrays yet forms a three dimensional, fully functional light recycling cavity.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A foldable light recycling cavity comprising
   a planar substrate having a first side and an opposite second side, said planar substrate having multiple segments;
   a flex circuit having a first side and an opposite second side, said opposite second side of said flex circuit being bonded to said first side of said planar substrate, said flex circuit being metal;
   at least one cut channel in said second side of said planar substrate between said multiple segments, each of said at least one cut channels forming at least one fold line on said first side of said planar substrate;
   at least two light emitting diodes mounted on said first side of said flex circuit; and
   wherein folding said planar substrate along said at least one fold line forms a light recycling cavity, said flex circuit acting as a hinge during folding said planar substrate, and said flex circuit on said multiple segments of said planar substrate forms the walls of said light recycling cavity.

2. The foldable light recycling cavity of claim 1 wherein said at least two light emitting diodes are each mounted on a bond pad on said first side of said flex circuit.

3. The foldable light recycling cavity of claim 1 wherein said flex circuit is copper.

4. The foldable light recycling cavity of claim 1 wherein said flex circuit has a ductile metal on first side of said flex circuit.

5. The foldable light recycling cavity of claim 4 wherein said ductile metal is gold.

6. The foldable light recycling cavity of claim 4 wherein said planar substrate is aluminum nitride, beryllium oxide, or alumina.

7. The foldable light cavity of claim 1 wherein flex circuit metal pads on said opposite second side of said flex circuit are soldered to planar substrate metal pads on said first side of said planar substrate.

8. The foldable light cavity of claim 1 wherein at least one scribe line in said opposite second side of said flex circuit superimpose on said at least one cut channel in said second side of said planar substrate.

9. The foldable light cavity of claim 1 wherein the thickness of the flex circuit matches the thickness of the height and thickness of the at least two light emitting diodes.

10. The foldable light recycling cavity of claim 1 further comprising a first highly reflective end cap mounted in a first open end of said light recycling cavity and a second highly reflective end cap mounted in a second open end of said light recycling cavity.

11. The foldable light recycling cavity of claim 1 further comprising four segments in said planar substrate and three fold lines in said planar substrate which form a four sided light recycling cavity with at least one light emitting diode on each side of said light recycling cavity.

12. The foldable light recycling cavity of claim 1 further comprising five segments in said planar substrate and four fold lines in said planar substrate which form a five sided light recycling cavity with at least one light emitting diode on each side of said light recycling cavity.

13. The foldable light recycling cavity of claim 1 wherein said flex circuit extends outside said light recycling cavity for external connections.

14. A method of forming a light recycling cavity comprising the steps of:
bonding the second side of a flex circuit on a first side of a planar substrate, said planar substrate having multiple segments;
cutting at least one channel in a second side of said planar substrate between said multiple segments, said second side of said planar substrate being opposite said first side of said planar substrate, each of said at least one cut channels forming at least one fold line on said first side of said planar substrate;
mounting at least two light emitting diodes on said first side of said flex circuit, said first side of said flex circuit being opposite said second side of said flex circuit; and
folding said planar substrate along said at least one fold line to form a light recycling cavity, said flex circuit acting as a hinge during folding and said flex circuit on said multiple segments of said planar substrate forming walls of said light recycling cavity.

15. The method of forming a light recycling cavity of claim 14 wherein three fold lines in said planar substrate and four segments in said planar substrate form a four sided light recycling cavity with at least one light emitting diode on each side of said light recycling cavity.

16. The method of forming a light recycling cavity of claim 14 wherein four fold lines in said planar substrate and five segments in said planar substrate form a five sided light recycling cavity with at least one light emitting diode on each side of said light recycling cavity.

17. The method of forming a light recycling cavity of claim 14 further comprising
scribing a line in said opposite second side of said flex circuit superimposed on said at least one cut channel in said second side of said planar substrate.

18. The method of forming a light recycling cavity of claim 14 further comprising
mounting a first highly reflective end cap in a first open end of said light recycling cavity and mounting a second highly reflective end cap in a second open end of said light recycling cavity.

* * * * *